United States Patent
Yamazawa et al.

(10) Patent No.: US 9,253,867 B2
(45) Date of Patent: Feb. 2, 2016

(54) PLASMA PROCESSING APPARATUS AND PLASMA PROCESSING METHOD

(75) Inventors: Yohei Yamazawa, Nirasaki (JP); Masashi Saito, Nirasaki (JP); Kazuki Denpoh, Nirasaki (JP); Chishio Koshimizu, Nirasaki (JP); Jun Yamawaku, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 965 days.

(21) Appl. No.: 12/913,183

(22) Filed: Oct. 27, 2010

(65) Prior Publication Data

US 2011/0094997 A1    Apr. 28, 2011

Related U.S. Application Data

(60) Provisional application No. 61/265,518, filed on Dec. 1, 2009.

(30) Foreign Application Priority Data

Oct. 27, 2009    (JP) ................. 2009-245990

(51) Int. Cl.
*H01L 21/306*    (2006.01)
*C23C 16/00*    (2006.01)
(Continued)

(52) U.S. Cl.
CPC .............. *H05H 1/46* (2013.01); *H01J 37/321* (2013.01)

(58) Field of Classification Search
CPC   H01J 37/321; H01J 37/3211; H01J 37/32119
USPC ....... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 5,109,790 A | 5/1992 | Matsumoto et al. |
| 5,280,154 A | 1/1994 | Cuomo et al. |

(Continued)

FOREIGN PATENT DOCUMENTS

| | | |
|---|---|---|
| CN | 1055495 A | 10/1991 |
| CN | 1392754 A | 1/2003 |

(Continued)

OTHER PUBLICATIONS

Chinese Office Action Issued Apr. 12, 2012 in Patent Application No. 201010525423.7.

(Continued)

*Primary Examiner* — Luz Alejandro Mulero
(74) *Attorney, Agent, or Firm* — Rothwell, Figg, Ernst & Manbeck, P.C.

(57) ABSTRACT

A plasma processing apparatus includes: an evacuable processing chamber including a dielectric window; a substrate supporting unit, provided in the processing chamber, for mounting thereon a target substrate; a processing gas supply unit for supplying a desired processing gas to the processing chamber to perform a plasma process on the target substrate; a first RF antenna, provided on the dielectric window, for generating a plasma by an inductive coupling in the processing chamber; and a first RF power supply unit for supplying an RF power to the first RF antenna. The first RF antenna includes a primary coil provided on or above the dielectric window and electrically connected to the first RF power supply unit; and a secondary coil provided such that the coils are coupled with each other by an electromagnetic induction therebetween while being arranged closer to a bottom surface of the dielectric window than the primary coil.

10 Claims, 18 Drawing Sheets

(51) Int. Cl.
*H05H 1/46* (2006.01)
*H01J 37/32* (2006.01)

(56) References Cited

U.S. PATENT DOCUMENTS

| | | | |
|---|---|---|---|
| 5,401,350 | A | 3/1995 | Patrick et al. |
| 5,620,523 | A | 4/1997 | Maeda et al. |
| 5,731,565 | A | 3/1998 | Gates |
| 5,800,619 | A | 9/1998 | Holland et al. |
| 5,907,221 | A | 5/1999 | Sato et al. |
| 5,919,382 | A | 7/1999 | Qian et al. |
| 6,016,131 | A | 1/2000 | Sato et al. |
| 6,229,264 | B1 | 5/2001 | Ni et al. |
| 6,252,354 | B1 | 6/2001 | Collins et al. |
| 6,414,648 | B1 * | 7/2002 | Holland et al. ............... 343/895 |
| 6,876,155 | B2 * | 4/2005 | Howald et al. ........... 315/111.51 |
| 2002/0041160 | A1 | 4/2002 | Barnes et al. |
| 2002/0189763 | A1 | 12/2002 | Kwon et al. |
| 2003/0111181 | A1 * | 6/2003 | Wang et al. ............... 156/345.48 |
| 2003/0145952 | A1 | 8/2003 | Wilcoxson et al. |
| 2004/0085246 | A1 | 5/2004 | Howald et al. |
| 2004/0124779 | A1 | 7/2004 | Howald et al. |
| 2004/0216676 | A1 | 11/2004 | Wilcoxson et al. |
| 2004/0223579 | A1 | 11/2004 | Lee et al. |
| 2005/0205211 | A1 | 9/2005 | Singh et al. |
| 2007/0256787 | A1 | 11/2007 | Chandrachood et al. |
| 2008/0185284 | A1 | 8/2008 | Chen et al. |
| 2008/0223521 | A1 * | 9/2008 | Kim et al. ................. 156/345.1 |

FOREIGN PATENT DOCUMENTS

| | | |
|---|---|---|
| CN | 1537405 A | 10/2004 |
| CN | 1689132 A | 10/2005 |
| CN | 101304630 A | 11/2008 |
| JP | 7-122397 A | 5/1995 |
| JP | 8-162288 A | 6/1996 |
| JP | 2001-52894 A | 2/2001 |
| JP | 2003-517197 | 5/2003 |
| JP | 2003-273028 A | 9/2003 |
| JP | 2004-537830 A | 12/2004 |
| JP | 2005-534150 | 11/2005 |
| TW | 510149 B | 11/2002 |
| TW | 575919 B | 2/2004 |
| TW | 200414790 A | 8/2004 |
| WO | 0000993 A1 | 1/2000 |

OTHER PUBLICATIONS

U.S. Office Action mailed Mar. 22, 2013 in co-pending U.S. Appl. No. 12/913,135.
U.S. Office Action mailed Mar. 22, 2013 in co-pending U.S. Appl. No. 12/913,162.

* cited by examiner

PLASMA PROCESSING APPARATUS AND PLASMA PROCESSING METHOD

CROSS-REFERENCE TO RELATED APPLICATIONS

This application claims priority to Japanese Patent Application No. 2009-245990 filed on Oct. 27, 2009 and U.S. Provisional Application No. 61/265,518 filed on Dec. 1, 2009, the entire contents of which are incorporated herein by reference.

FIELD OF THE INVENTION

The present invention relates to a technique for performing a plasma process on a target substrate to be processed; and, more particularly, to an inductively coupled plasma processing apparatus and a plasma processing method therefor.

BACKGROUND OF THE INVENTION

In the manufacturing process of a semiconductor device or a flat panel display (FPD), a plasma is widely used in a process such as etching, deposit, oxidation, sputtering or the like since it has a good reactivity with a processing gas at a relatively low temperature. In such plasma process, the plasma is mostly generated by a radio frequency (RF) discharge in the megahertz range. Specifically, the plasma generated by the RF discharge is classified into a capacitively coupled plasma and an inductively coupled plasma.

Typically, an inductively coupled plasma processing apparatus includes a processing chamber, at least a portion (e.g., a ceiling portion) of which is formed of a dielectric window; and a coil-shaped RF antenna provided outside the dielectric window, and an RF power is supplied to the RF antenna. The processing chamber serves as a vacuum chamber capable of being depressurized, and a target substrate (e.g., a semiconductor wafer, a glass substrate or the like) to be processed is provided at a central portion of the chamber. Further, a processing gas is introduced into a processing space between the dielectric window and the substrate.

As an RF current flows though the RF antenna, an RF magnetic field is generated around the RF antenna, wherein the magnetic force lines of the RF magnetic field travel through the dielectric window and the processing space. The temporal alteration of the generated RF magnetic field causes an electric field to be induced azimuthally. Moreover, electrons azimuthally accelerated by the induced electric field collide with molecules and/or atoms of the processing gas, to thereby ionize the processing gas and generate a plasma in a doughnut shape.

By increasing the size of the processing space in the chamber, the plasma is efficiently diffused in all directions (especially, in the radical direction), thereby making the density of the plasma on the substrate uniform. However, the uniformity of the plasma density on the substrate that is obtained by merely using a typical RF antenna is generally insufficient for the plasma process.

Accordingly, even as for the inductively coupled plasma processing apparatus, it becomes one of the most important factors to improve the uniformity of the plasma density on the substrate, since it determines the uniformity and the reproducibility of the plasma process itself and, furthermore, the manufacturing production yield.

Typically, in the plasma processing apparatus, the plasma density may be made uniform in two, i.e., azimuthal and radial directions.

As for the uniformity in the azimuthal direction, since the RF antenna includes an RF input-output terminal connected through an RF power supply line to an RF power supply in a loop thereof, it is inevitable to employ a nonaxisymmetric antenna configuration. This serves as a main factor that makes the plasma density nonuniform in the azimuthal direction. Accordingly, the uniformity in the azimuthal direction can conventionally be improved by increasing the number of nonaxisymmetric or singularity locations of the RF antenna at a regular interval in the same direction (see, e.g., U.S. Pat. No. 5,800,619). Alternatively, by using two-layered series-connected coils as the RF antenna, wherein the RF power supply wire-connected locations (input-output terminals) provided in the upper coil are hidden behind the lower coil, the locations may not be electromagnetically seen from the plasma (see, e.g., Japanese Patent Application Publication No. 2003-517197).

Moreover, as for the radial direction, the plasma density distribution characteristics (profile) of the plasma generated in the doughnut shape around the dielectric window in the chamber are important and, thus, the profile of the core plasma density distribution determines the uniformity of the plasma density distribution that can be obtained on the substrate after the diffusion. In this regard, the conventional method for dividing the RF antenna into a plurality of segments in the radial direction is mostly employed. Further, such RF antenna dividing method includes a first method for individually supplying RF powers to the respective antenna segments (see, e.g., U.S. Pat. No. 5,401,350); and a second method for controlling the division ratio of the RF power that is divided from one RF power supply to all the antenna segments by changing each impedance of the antenna segments in an additional circuit such as a capacitor or the like (see, e.g., U.S. Pat. No. 5,907,221).

However, such conventional methods for improving the uniformity of the plasma density distribution is disadvantageous in that it is difficult to manufacture any type of RF antenna for improving the uniformity in the azimuthal or radial direction due to its complex configuration; or the loads of the RF power supply system (RF power supply and matcher) are increased.

Especially, the conventional method for improving the uniformity in the azimuthal direction of the plasma density distribution has the restriction in the accuracy and improvement of the uniformity since an antenna portion (e.g., the lower antenna) attributable to the generation of inductive coupling plasma does not have an exactly axisymmetric shape.

SUMMARY OF THE INVENTION

In view of the above, the present invention provides an inductively coupled plasma processing apparatus and a plasma processing method therefor, capable of improving the uniformity and controllability of a plasma density distribution, with a simple configuration of its RF antenna that can easily be manufactured since loads of its RF power supply system become small.

In accordance with an aspect of the present invention, there is provided a plasma processing apparatus. The apparatus includes: a processing chamber including a dielectric window; a substrate supporting unit, provided in the processing chamber, for mounting thereon a target substrate to be processed; a processing gas supply unit for supplying a desired processing gas to the processing chamber to perform a desired plasma process on the target substrate; a first RF antenna, provided on the dielectric window, for generating a plasma from the processing gas by an inductive coupling in the processing chamber; and a first RF power supply unit for supplying an RF power to the first RF antenna, the RF power having an appropriate frequency for RF discharge of the processing gas. The first RF antenna includes a primary coil provided on or above the dielectric window and electrically connected to the first RF power supply unit through an RF power supply line; and a secondary coil provided at a portion such that the coils are coupled with each other by an electromagnetic induction therebetween, the secondary coil arranged closer to a bottom surface of the dielectric window than the primary coil.

In accordance with another aspect of the present invention, there is provided a plasma processing method. The method includes: arranging a target substrate to be processed at a predetermined portion below a dielectric window in a processing chamber including the dielectric window; supplying a desired processing gas to the processing chamber from a processing gas supply unit; maintaining a depressurized state of the processing chamber at a predetermined pressure level; supplying an RF power having a preset frequency from an RF power source to a primary coil arranged on or above the dielectric window to allow an RF current to flow through the primary coil; inducing a current through the RF current by an electromagnetic induction to allow the induced current to flow through a secondary coil arranged closer to a bottom surface of the dielectric window than the primary coil; generating a plasma from the processing gas close to the dielectric window in the processing chamber by an induced electric field and an RF power magnetic field generated by the induced current flowing through the secondary coil; diffusing the generated plasma in the processing chamber; and performing a desired plasma process on the target substrate by using the plasma.

In the present invention, once an RF power for RF discharge is supplied to the primary coil and, thus, the RF current flows through the primary coil, an RF energy is transferred from the primary coil to the secondary coil by the inductive coupling and, thus, the inductive coupling plasma is generated by the electromagnetic energy that is transferred from the secondary coil to the processing chamber through the dielectric window. In other words, by coupling by the electromagnetic induction the primary coil with the secondary coil and the secondary coil with the plasma in the processing chamber, the RF power is supplied to the load, i.e., the plasma in the processing chamber through the primary coil and the secondary coil. The secondary coil for mostly supplying the electromagnetic energy to the processing gas in the processing chamber can be formed of one or more completely axisymmetric endless coils having no space-like singularity (power-supply point).

Accordingly, it is possible to make the plasma density of the plasma generated in the doughnut shape in the processing space of the processing chamber uniform in the azimuthal direction and, furthermore, the density distribution of the plasma around the substrate supporting unit (i.e., on the semiconductor wafer W) uniform in the azimuthal direction.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

Figure 1:
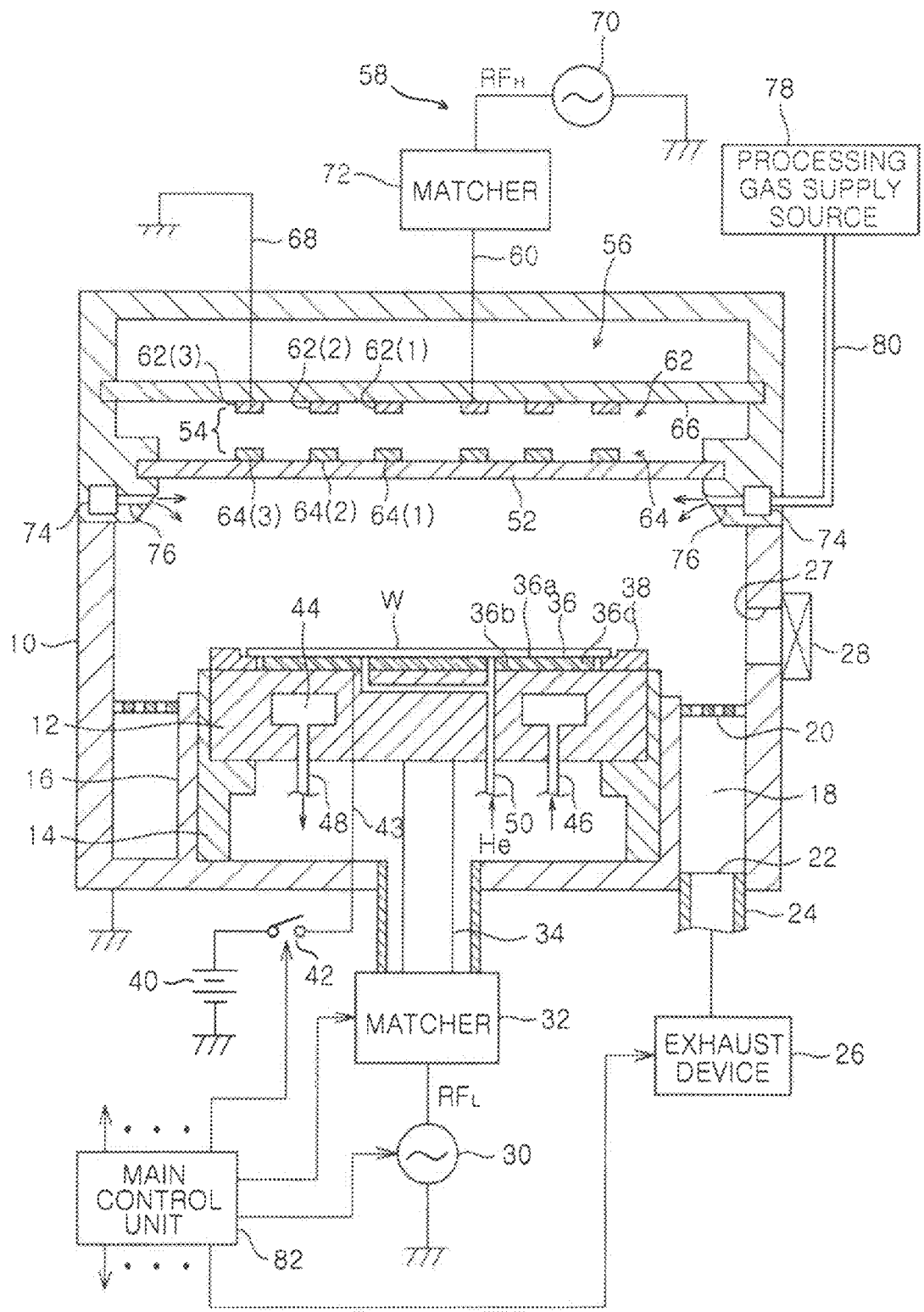
FIG. 1 is a longitudinal cross sectional view showing a configuration of an inductively coupled plasma etching apparatus in accordance with an embodiment of the present invention.

FIG. 1 shows a configuration of an inductively coupled plasma etching apparatus in accordance with an embodiment of the present invention. The inductively coupled plasma etching apparatus is of a type using a planar coil type RF antenna, and includes a cylindrical vacuum chamber (processing chamber) 10 made of a metal, e.g., aluminum, stainless steel or the like. The chamber 10 is frame-grounded.

In the inductively coupled plasma etching apparatus, various units having no involvement in plasma generation will be described first. At a lower central portion of the chamber 10, a circular plate-shaped susceptor 12 for mounting thereon a target substrate, e.g., a semiconductor wafer W as a substrate supporting table is horizontally arranged. The susceptor 12 also serves as an RF electrode. The susceptor 12, which is made of, e.g., aluminum, is supported by an insulating tubular support 14 uprightly extending from a bottom portion of the chamber 10.

A conductive tubular support part 16 is provided uprightly extending from the bottom portion of the chamber 10 along the periphery of the insulating tubular support 14, and an annular exhaust path 18 is defined between the support part 16 and an inner wall of the chamber 10. Moreover, an annular baffle plate 20 is attached to an entrance or a top portion of the exhaust path 18, and an exhaust port 22 is provided at a bottom portion thereof.

To allow a gas to uniformly flow in the chamber 10 axisymmetrically with regard to the semiconductor wafer W on the susceptor 12, it is preferable to provide a plural number of exhaust ports 22 at a regular interval circumferentially. The exhaust ports 22 are connected to an exhaust device 26 via respective exhaust pipes 24. The exhaust device 26 includes a vacuum pump such as a turbo molecular pump to evacuate a plasma-processing space in the chamber 10 to a predetermined vacuum level. Attached to the sidewall of the chamber 10 is a gate valve 28 for opening and closing a loading/unloading port 27.

An RF power supply 30 for an RF bias is electrically connected to the susceptor 12 via a matcher 32 and a power supply rod 34. The RF power supply 30 outputs a variable RF power $RF_L$ of an appropriate frequency (e.g., 13.56 MHz or less) to control the energy for attracting ions toward the semiconductor wafer W. The matcher 32 includes a variable-reactance matching circuit for performing the matching between the impedances of the RF power supply 30 and the load (mainly, susceptor, plasma and chamber), and the matching circuit includes a blocking capacitor for generating a self-bias.

An electrostatic chuck 36 is provided on an upper surface of the susceptor 12 to hold the semiconductor wafer W by an electrostatic attraction force, and a focus ring 38 is provided around the electrostatic chuck 36 to annularly surround the periphery of the semiconductor wafer W. The electrostatic chuck 36 includes an electrode 36a made of a conductive film and a pair of dielectric films 36b and 36c. A high voltage DC power supply 40 is electrically connected to the electrode 36a via a switch 42 by using a coated line 43. By applying a high DC voltage from the DC power supply 40 to the electrode 36a, the semiconductor wafer W can be attracted to and held on the electrostatic chuck 36 by the electrostatic force.

A coolant path 44, which extends in, e.g., a circumferential direction, is provided inside the susceptor 12. A coolant, e.g., a cooling water, of a predetermined temperature is supplied from a chiller unit (not shown) to the coolant path 44 to be circulated through pipelines 46 and 48. By adjusting the temperature of the coolant, it is possible to control a process temperature of the semiconductor wafer W held on the electrostatic chuck 36.

Moreover, a heat transfer gas, e.g., He gas, is supplied from a heat transfer gas supply unit (not shown) to a space between a top surface of the electrostatic chuck 36 and a bottom surface of the semiconductor wafer W through a gas supply line 50. Further, an elevating mechanism (not shown) including lift pins capable of being moved up and down while vertically extending through the susceptor 12 and the like is provided to load and unload the semiconductor wafer W.

Figure 2:
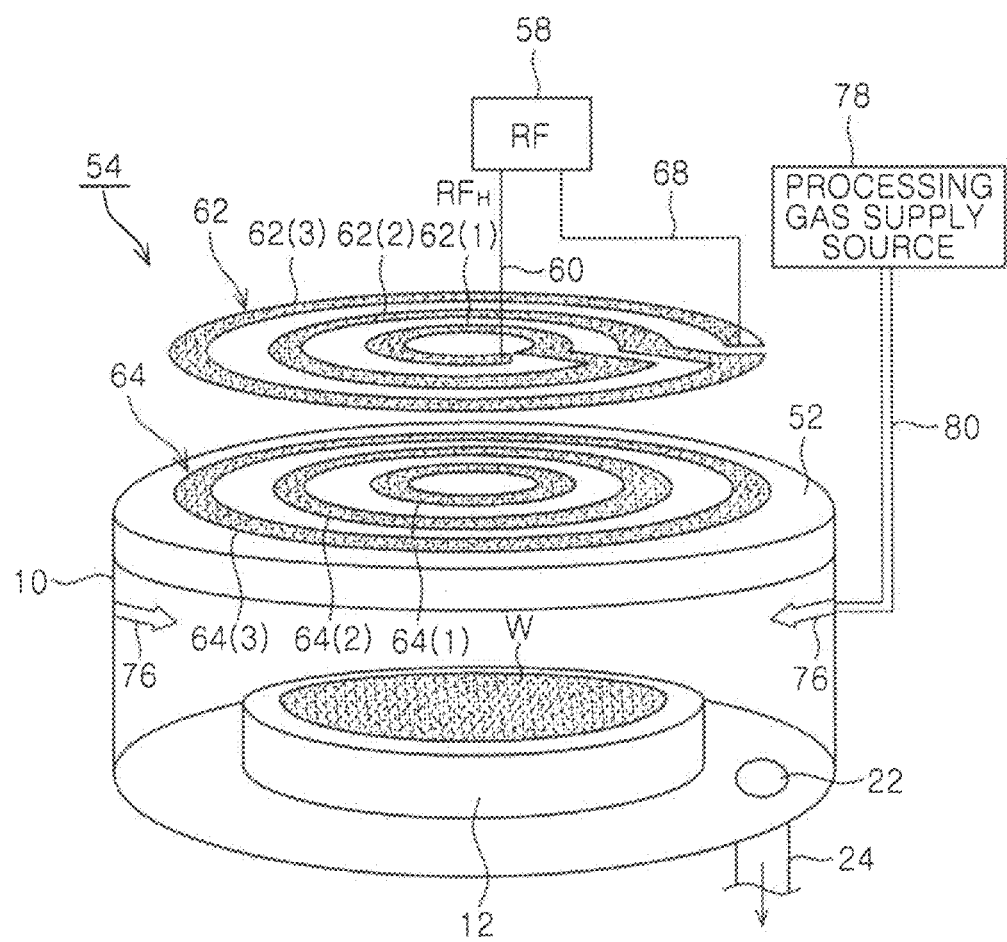
FIG. 2 is a perspective view showing main elements of a plasma generation unit in the inductively coupled plasma etching apparatus shown in FIG. 1.

Next, various units having involvement in the plasma generation in the inductively coupled plasma etching apparatus will be described. FIG. 2 shows main elements of a plasma generation unit in the inductively coupled plasma etching apparatus.

A ceiling of the chamber 10 is separated from the susceptor 12 at a relatively large distance, and a circular dielectric window 52 formed of, e.g., a quartz plate is airtightly provided in the ceiling. As a single unit with the chamber 10, an antenna chamber 56 for accommodating an RF antenna 54 while electronically shielding it from the outside is provided on the dielectric window 52. The RF antenna 54 is used to generate an inductively coupled plasma in the chamber 10.

In the present embodiment, the RF antenna 54 includes a primary coil 62 arranged above and separated from the dielectric window 52 and connected to an RF power supply line 60 of an RF power supply unit 58; and a secondary coil 64 arranged at a portion such that the coils 62 and 64 can be coupled with each other by the electromagnetic induction therebetween while being electrically floated from the primary coil 62 closer to a bottom surface (i.e., a surface facing the processing space) of the dielectric window 52 than the primary coil 62.

In FIG. 2, the secondary coil 64 is horizontally mounted on the top surface of dielectric window 52, and the primary coil 62 is horizontally mounted on a support plate 66 formed of an insulator, provided above and separated from the secondary coil 64 at an appropriate distance. Typically, the coils 62 and 64 are arranged to be concentric with each other horizontally and, furthermore, with the chamber 10 and the susceptor 12 horizontally.

Figure 3A:
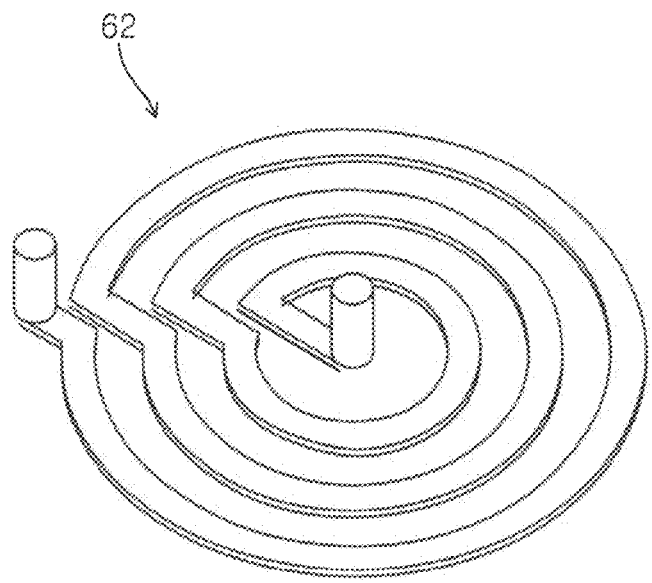
FIG. 3A is a perspective view showing a concentric coil.
Figure 3B:
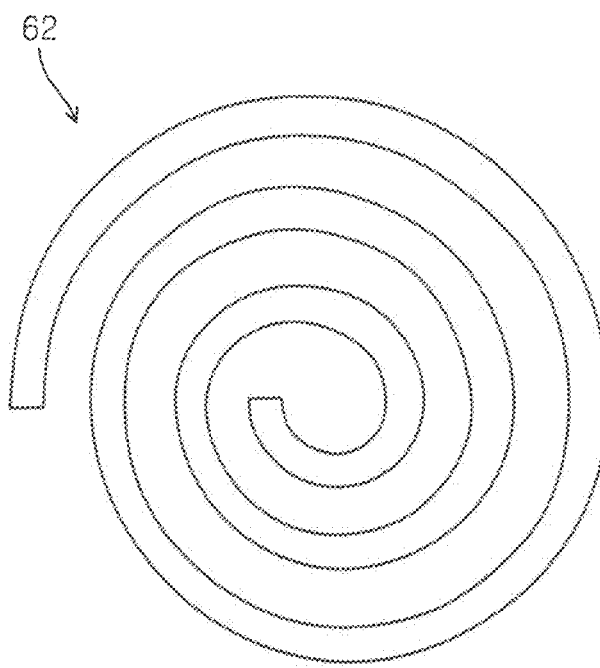
FIG. 3B is a perspective view showing a spiral coil.

Preferably, the primary coil 62 formed of, e.g., a multi-wound coil has a concentric shape with regular radiuses as shown in FIGS. 2 and 3A. Alternatively, the primary coil 62 may have another shape, e.g., a spiral shape shown in FIG. 3E. Typically, a central end portion of the primary coil 62 is connected to the RF power supply line of the RF power supply unit 58, and a peripheral end portion is electrically connected to a ground potential through a ground line 68. The primary coil 62 is preferably made of, e.g., a copper-based metal having a high conductivity.

Preferably, as shown in FIG. 2A, the secondary coil 64 is, e.g., a combination coil including a plurality of, e.g., three, endless coils 64(1) to 64(3) having different diameters that are concentrically arranged. Each of the endless coils 64(1) to 64(3) is preferably made of, e.g., a copper-based metal having a high conductivity. Alternatively, the endless coils 64(1) to 64(3) may be made of, e.g., a semiconductor such as Si or SiC.

In FIG. 2, the primary coil is formed of the concentric coil that is wound three times. An inner wound portion 62(1), an intermediate wound portion 62(2) and an outer wound portion 62(3) of the primary coil 62 are respectively arranged to vertically opposite to the inner endless coil 64(1), the intermediate endless coil 64(2) and the outer endless coil 64(3) of the secondary coil 64.

The RF power supply unit 58 includes an RF power supply 70 and a matcher 72 and outputs a variable RF power $RF_H$ of an appropriate frequency (e.g., 13.56 MHz or more) for plasma generation by RF discharge. The matcher 72 includes a variable-reactance matching circuit for performing the matching between the impedances of the RF power supply 70 and the load (mainly, RF antenna, plasma and correction coil).

A processing gas supply unit for supplying a processing gas to the chamber 10 includes an annular manifold or buffer unit 74 provided inside (or outside) the sidewall of the chamber 10 to be located at a place slightly lower than the dielectric window 52; a plurality of sidewall gas injection holes 76 circumferentially formed on the sidewall at a regular interval and opened to the plasma-generation space from the buffer unit 74; and a gas supply line 80 extended from a processing gas supply source 78 to the buffer unit 74. The processing gas supply source 78 includes a mass flow controller and an on-off valve, which are not shown.

A main control unit 82 includes, e.g., a microcomputer and controls the overall operation (sequence) of the plasma etching apparatus and individual operations of various units, e.g., the exhaust device 26, the RF power supplies 30 and 70, the matchers 32 and 72, the switch 42 of the electrostatic chuck, the processing gas supply source 78, the chiller unit (not shown), the heat-transfer gas supply unit (not shown) and the like.

When the inductively coupled plasma etching apparatus performs an etching process, the gate valve 28 is first opened to load a target substrate, i.e., a semiconductor wafer W, into the chamber 10 and mount it onto the electrostatic chuck 36. Then, the gate valve 28 is closed, and an etching gas (typically, a gaseous mixture) is introduced from the processing gas supply source 78, via the buffer unit 74, into the chamber 10 at a preset flow rate and flow rate ratio through the sidewall gas injection holes 76 by using the gas supply line 80. Thereafter, the RF power supply 70 of the RF power supply unit 58 is turned on to output a plasma-generating RF power $RF_H$ at a predetermined RF level, so that a current of the RF power $RF_H$ is supplied to the primary coil 62 of the RF antenna 54 through the RF power supply line 60 via the matcher 72. In addition, the RF power supply 30 is turned on to output an ion-attracting control RF power $RF_L$ at a predetermined RF level, so that the RF power $RF_L$ is supplied to the susceptor 12 through the power supply rod 34 via the matcher 32.

Further, a heat-transfer gas (i.e., He gas) is supplied from the heat-transfer gas supply unit to a contact interface between the electrostatic chuck 36 and the semiconductor wafer W, and the switch is turned on, so that the heat-transfer gas is confined in the contact interface by the electrostatic attraction force of the electrostatic chuck 36.

The etching gas injected through the sidewall gas injection holes 76 is uniformly diffused in the processing space below the dielectric window 52. At this time, magnetic force lines (magnetic flux) generated around the primary coil 62 by the current of the RF power $RF_H$ flowing through the primary coil 62 of the RF antenna 54 are interlinked with the secondary coil 64, so that an electromotive force is induced in the secondary coil by the temporal alteration of the generated magnetic flux, thereby allowing a current (i.e., an induced current) to flow in the loop.

Magnetic force lines are generated by the induced current flowing through the secondary coil 64, and the generated magnetic force lines travel through dielectric window 52 and across the processing space (plasma generation space) of the chamber 10, to thereby induce an electric field azimuthally in the processing space. Electrons azimuthally accelerated by the induced electric field collide with molecules and/or atoms in the etching gas, to thereby ionize the etching gas and generate a plasma in a doughnut shape. As such, the plasma is dominantly generated by the electric field caused by the secondary coil 64, while it is hardly affected by the primary coil 62.

Here, the expression "plasma in a doughnut shape" indicates not only a state where the plasma is generated only at the radially outer portion in the chamber 10 without being generated at the radially inner portion (at the central portion) therein but also a state where the volume or density of the plasma generated at the radially outer portion becomes larger than that at the radially inner portion. Moreover, if the kind of the processing gas, the pressure inside the chamber 10 and/or the like are changed, the plasma may be generated in another shape instead of the doughnut shape.

In the wide processing space, radicals and ions of the plasma generated in the doughnut shape are diffused in all directions, so that the radicals isotropically pour down and the ions are attracted by the DC bias onto a top surface (target surface) of the semiconductor wafer W. Accordingly, plasma active species cause chemical and physical reactions on the target surface of the semiconductor wafer W, thereby etching a target film into a predetermined pattern. In the present embodiment, as will be described later, it is possible to significantly improve the radial uniformities in the plasma process properties in the azimuthal direction as well as in the radial direction, i.e., etching properties (etching rate, selectivity, etching shape and the like), of the semiconductor wafer W.

As such, in the inductively coupled plasma etching apparatus of the present embodiment, the RF antenna 54 provided above a ceiling window (in the antenna chamber 56) of the chamber 10 includes the primary coil 62 and the secondary coil 64 arranged one above the other and completely separated from each other. Accordingly, once an RF power $RF_H$ for the RF discharge is supplied from the RF power supply unit 58 to the primary coil 62, the energy is transferred by the inductive coupling between the coils 62 and 64 and, thus, an inductively coupled plasma is generated by the electromagnetic energy that is discharged from the secondary coil 64 into the processing gas in the chamber 10 by traveling through dielectric window 52.

In other words, by coupling by the electromagnetic induction the coils 62 and 64 with each other and the secondary coil 64 with the plasma in the chamber 10, the RF power $RF_H$ is supplied to the load, i.e., the plasma in the chamber 10 through the coils 62 and 64.

With such method for supplying an RF power to a plasma through the inductive coupling between a plurality of coils, it is possible to provide the final stage coil, i.e., the secondary coil 64 for supplying the electromagnetic energy to the processing gas in the chamber 10 through the dielectric window 52, serving as a completely axisymmetric endless coil having no space-like singularity (power-supply point). Accordingly, it is possible to make the plasma density of the plasma generated in the doughnut shape in the processing space of the chamber 10 uniform in the azimuthal direction and, furthermore, the density distribution of the plasma around the susceptor 12 (i.e., on the semiconductor wafer W) uniform in the azimuthal direction.

Further, since each of the coils 62 and 64 has a simple configuration, it is possible to easily manufacture the coils 62 and 64. No significant load is applied to the RF power supply unit 58.

Besides, since the primary coil 62 includes an input-output terminal for RF power supply and is not an axisymmetric coil, the magnetic flux interlinked with the secondary coil 64, i.e., a magnetic field generated around the primary coil 62 by the RF power $RF_H$ flowing through the primary coil 62, is not uniform in the azimuthal direction. However, the induced current flowing through the secondary coil 64 is the same at any portion of the loop, and the secondary coil 64 is an axisymmetric circular endless coil. Accordingly, a magnetic field generated around the secondary coil 64 (specifically, in the chamber 10) by the induced current flowing therethrough becomes uniform over one period in the azimuthal direction.

In the RF antenna 54 of the present embodiment, the planar primary coil 62 is horizontally arranged above the dielectric window 52, and the planar secondary coil 64 is horizontally mounted on the top surface of the dielectric window 52. However, in the present invention, such layout configuration of the RF antenna 54 is merely an example, and various modifications may be made instead.

Figure 4A:
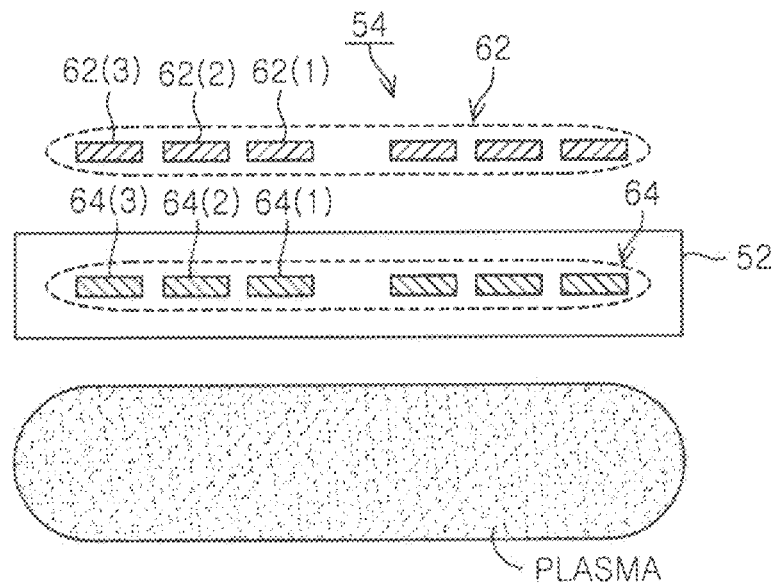
FIG. 4A is a schematic cross sectional view showing a first modification of the layout configuration of an RF antenna in accordance with the present embodiment.

As described above, the secondary coil 64 is formed of one or more endless coils 64(1) to 64(3), and the line connection to the outside is unnecessary. Accordingly, as shown in FIG. 4A, the secondary coil 64 (endless coils 64(1) to 64(3)) may be buried in the dielectric window 52. In this case, as the layout configuration shown in FIG. 4B, it is preferable to provide each of the endless coils 64(1) to 64(3) at independent height positions. Alternatively, one part of the secondary coil 64 (endless coils 64(1) to 64(3)) may be provided in the dielectric window 52, and the other part thereof may be provided on the dielectric window 52.

Figure 4B:
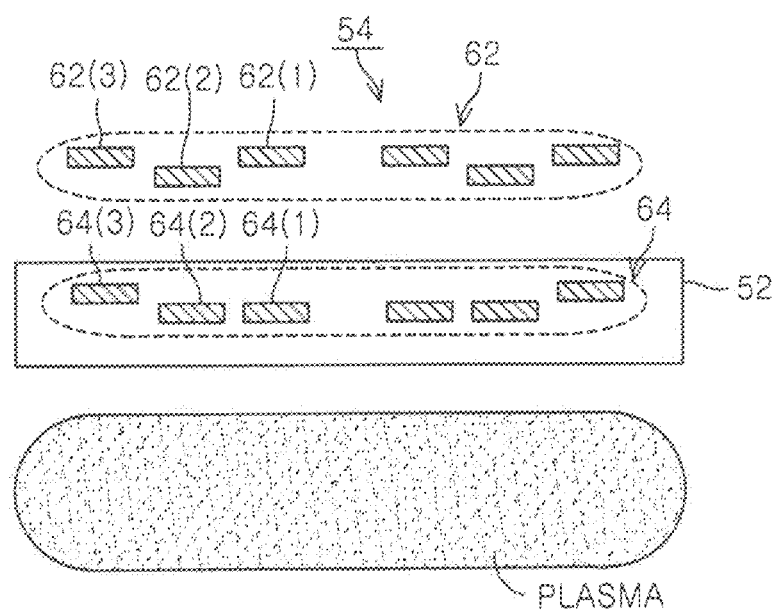
FIG. 4B is a schematic cross sectional view showing a second modification of the layout configuration of the RF antenna in accordance with the present embodiment.

Similarly, the primary coil 62 is not limited to the planar type. For example, as shown in FIG. 4B, the height positions of the wound portions 62(1) to 62(3) may preferably be changed depending on those of the corresponding endless coils 64(1) to 64(3) in such a way that the overall valance and the efficiency of the inductive coupling between the wound portions 62(1) to 62(3) and the corresponding endless coils 64(1) to 64(3) can be optimized.

Figure 4C:
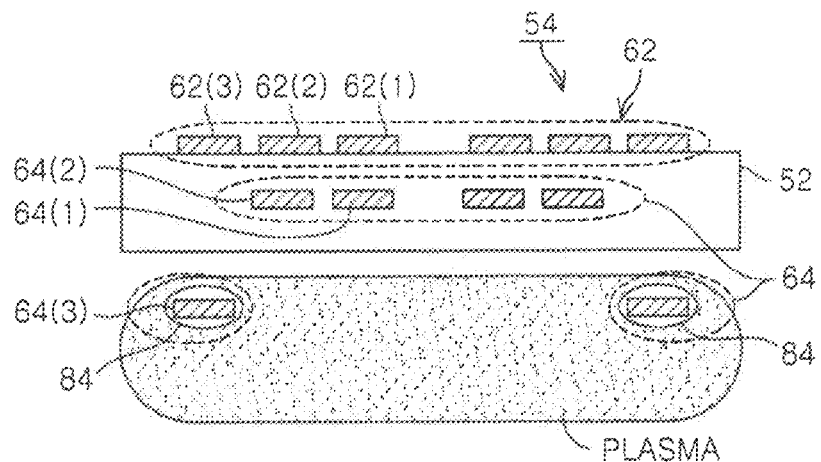
FIG. 4C is a schematic cross sectional view showing a third modification of the layout configuration of the RF antenna in accordance with the present embodiment.

Further alternatively, as shown in FIG. 4C, one part, e.g., the outer endless coil 64(3) of the endless coils 64(1) to 64(3) of the secondary coil 64 may be arranged immediately below the dielectric window 52, i.e., a plasma-generation area in the chamber 10. However, in case that the endless coil 64(3) is made of, e.g., a metal such as copper, it is preferable to cover the endless coil 64(3) with an anti-contamination hollow ring cover 84 made of, e.g., quartz.

Further, in case that the secondary coil 64 is provided in the dielectric window 52 or the chamber 10, the primary coil 62 may be arranged closest to the dielectric window 52. For example, as shown in FIG. 4C, the primary coil 62 may be arranged on the top surface of the dielectric window 52.

Figure 4D:
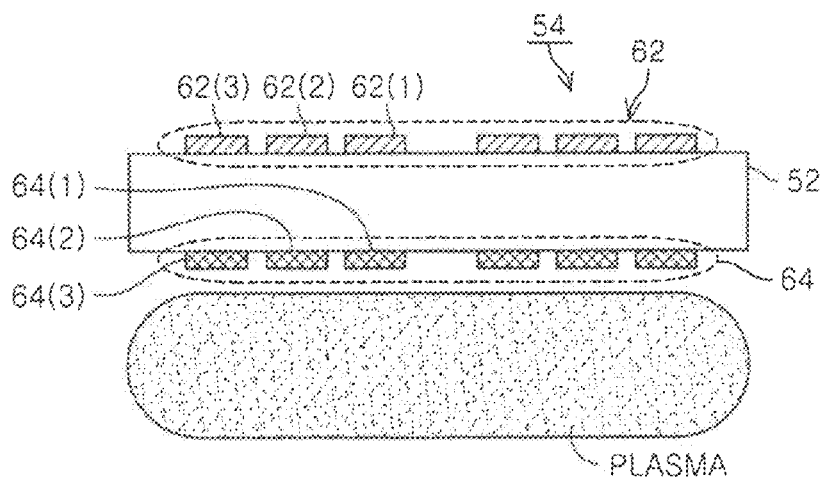
FIG. 4D is a schematic cross sectional view showing a fourth modification of the layout configuration of the RF antenna in accordance with the present embodiment.
Figure 4E:
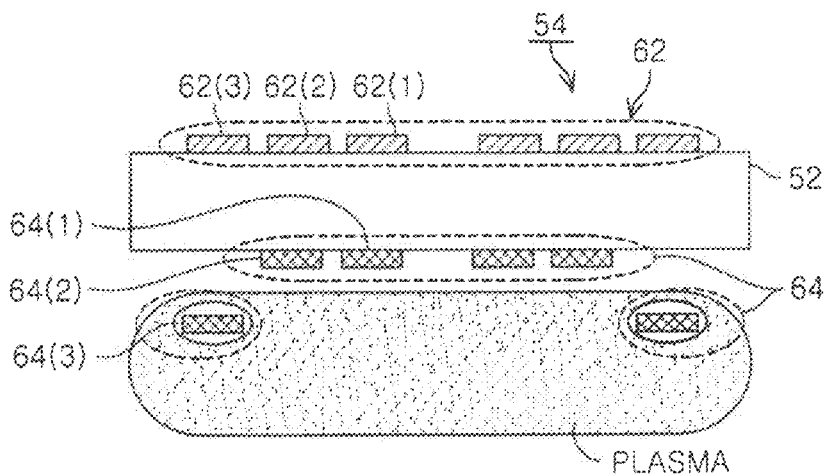
FIG. 4E is a schematic cross sectional view showing a fifth modification of the layout configuration of the RF antenna in accordance with the present embodiment.

As another layout configuration shown in FIGS. 4D and 4E, in case that each of the endless coils 64(1) to 64(3) of the secondary coil 64 is made of, e.g., Si or SiC, the endless coils 64(1) to 64(3) may be exposed without being covered with in the hollow ring cover and arranged on the bottom surface of the dielectric window 52 or in the plasma-generation area.

In the present embodiment, there may be various modifications of the supplying method for supplying the RF power $RF_H$ to the primary coil 62 of the RF antenna 54.

In the RF antenna 54 shown in FIG. 2, the wound portions 62(1) to 62(3) of the primary coil 62 are connected in series to the single RF power supply unit 58.

Figure 5:
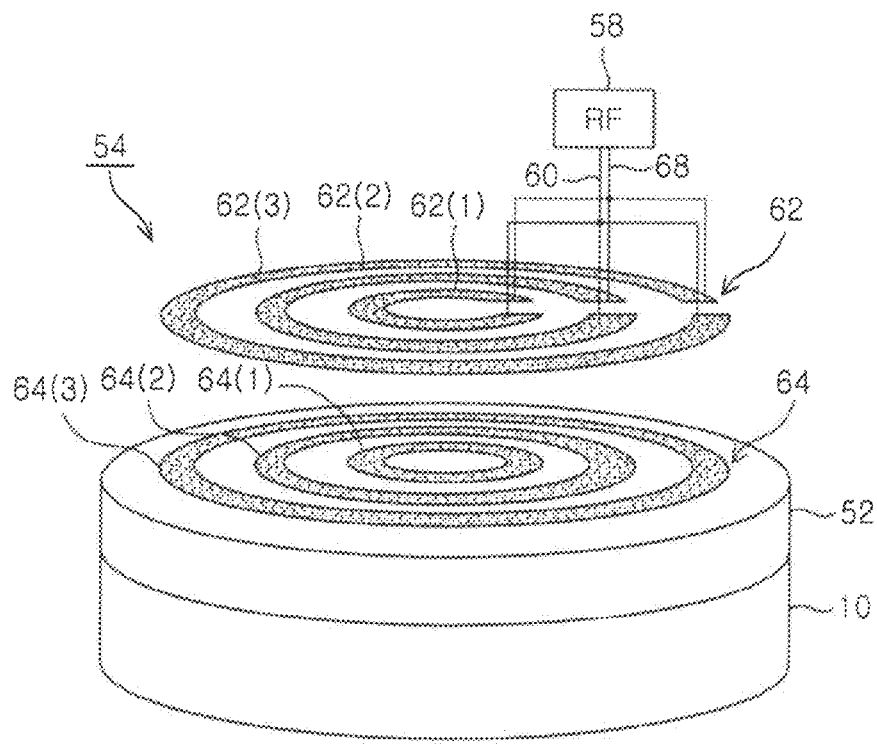
FIG. 5 shows a modification of an RF power supply layout of the RF antenna in accordance with the present embodiment.

However, as shown in FIG. 5, the wound portions 62(1) to 62(3) may be connected in parallel to the single RF power supply unit 58. In this case, the current of the RF power $RF_H$ supplied from the RF power supply unit 58 is branched into the wound portions 62(1) to 62(3). Relatively large current is supplied to the wound portion having a relatively low impedance (typically, the internal wound portion 62(1)), and relatively small current is supplied to the wound portion having a relatively high impedance (typically, the outer wound portion 62(3)).

Figure 6:
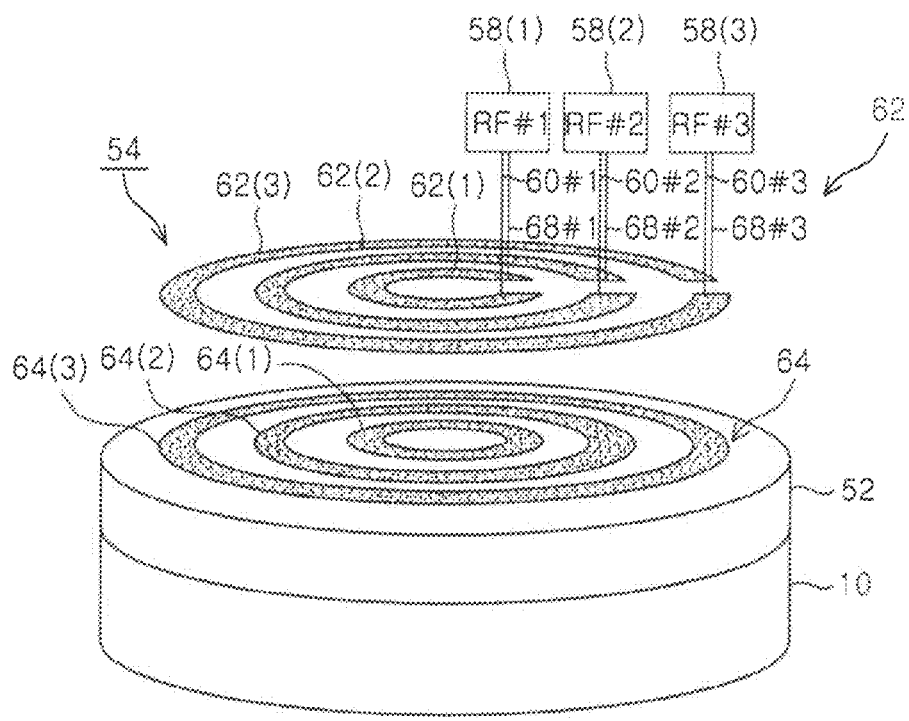
FIG. 6 shows another modification of the RF power supply layout of the RF antenna in accordance with the present embodiment.

Alternatively, as shown in FIG. 6, the wound portions 62(1) to 62(3) may respectively be connected to a plurality of the RF power supply units 58(1) to 58(3). In this case, RF currents or RF current powers may respectively be supplied from the RF power supply units 58(1) to 58(3) to the wound portions 62(1) to 62(3) regardless of their relative impedances.

Figure 7A:
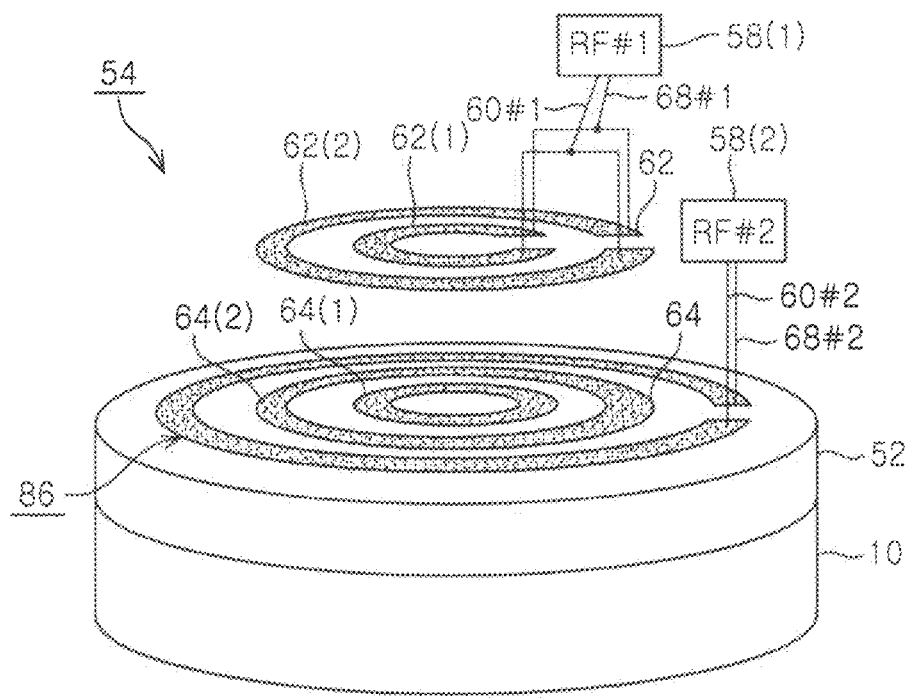
FIG. 7A a perspective view schematically showing an example of an antenna layout configuration in the case of including a plurality of RF antennas.
Figure 7B:
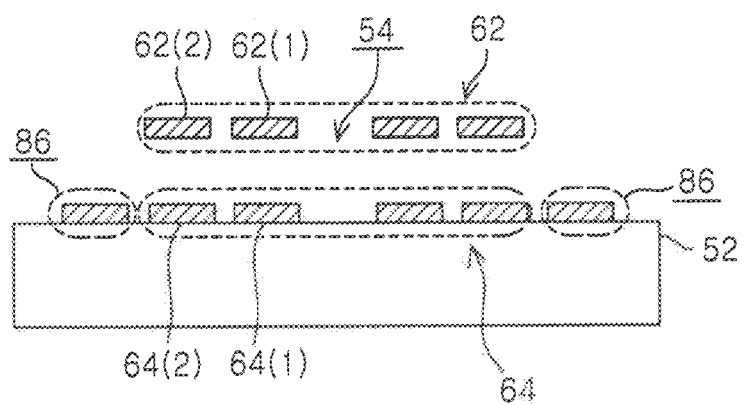
FIG. 7B is a schematic cross sectional view showing the antenna layout configuration.

Further alternatively, as shown in FIGS. 7A and 7B, an additional RF antenna 86 that is independent of the RF antenna 54 may be arranged around the dielectric window 52. In FIGS. 7A and 7B, the RF antennas 54 and 86 are respectively arranged at the radially inner portion (central portion) and the radially outer portion (peripheral portion) of the dielectric window 52. The RF antenna 86 may be a single-wound (or multi-wound) concentric coil as shown above or a spiral coil. Preferably, dedicated RF power supply units 58(1) and 58(2) are respectively provided to supply RF currents of different levels to both of the RF antennas 54 and 86. However, the RF current supplied from the single RF power supply unit 58 may be divided into two RF currents to be supplied to the RF antennas 54 and 86.

Figure 8A:
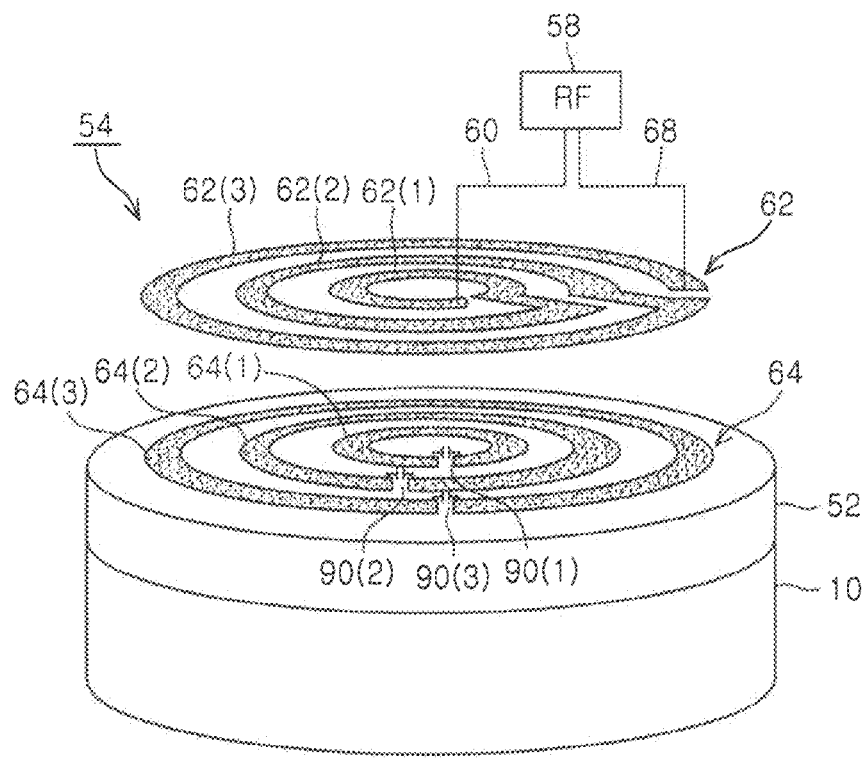
FIG. 8A is a perspective view showing how capacitors are respectively provided in loops of the RF antennas in accordance with the present embodiment.
Figure 8B:
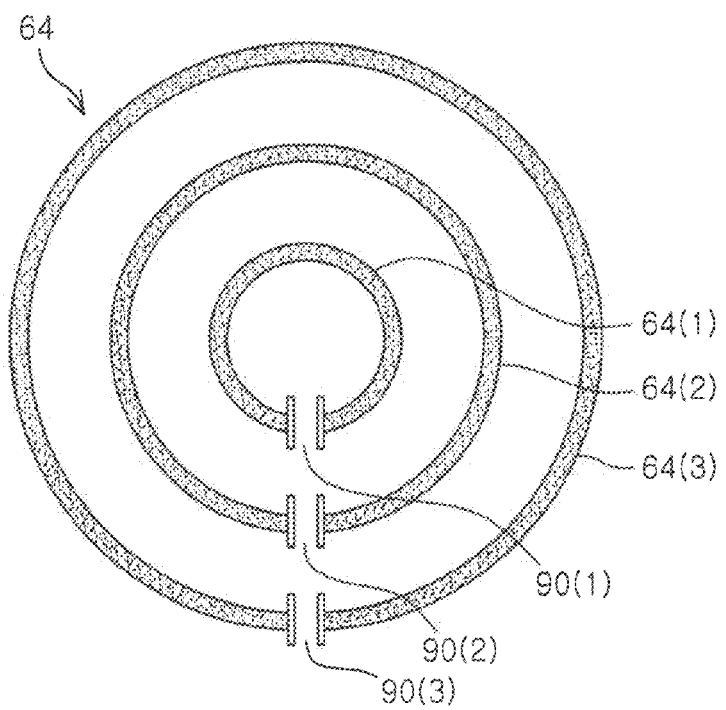
FIG. 8B is a top view showing how the capacitors are respectively provided in the loops of the RF antennas in accordance with the present embodiment.

Meanwhile, a capacitor may preferably be provided in the loop of the secondary coil 64 of the RF antenna 54. In case that the secondary coil 64 is formed of the endless coils 64(1) to 64(3), the capacitor may be provided in the loop of one (e.g., the endless coil 64(3)) or the loops of all the endless coils 64(1) to 64(3). Specifically, a cutout having a gap width of, e.g., 5 mm may be formed at a circumferential location of each coil conductor of the endless coil 64(1) to 64(3), and a capacitor may be provided at each of the cutouts. FIGS. 8A and 8B show an example where capacitors 90(1) to 90(3) are respectively provided in the loops of the endless coils 64(1) to 64(3).

Following electromagnetic field simulations were performed by the present inventors for the inductively coupled plasma etching apparatus of the present embodiment.

Figure 9A:
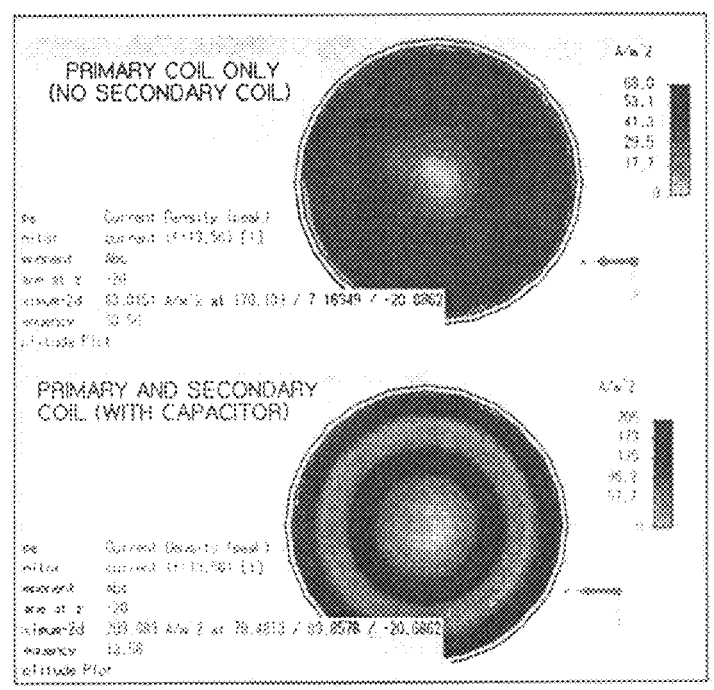
FIG. 9A is a contour plot diagram showing a distribution of an induced current that is excited in a plasma in a test example and a comparison example.
Figure 9B:
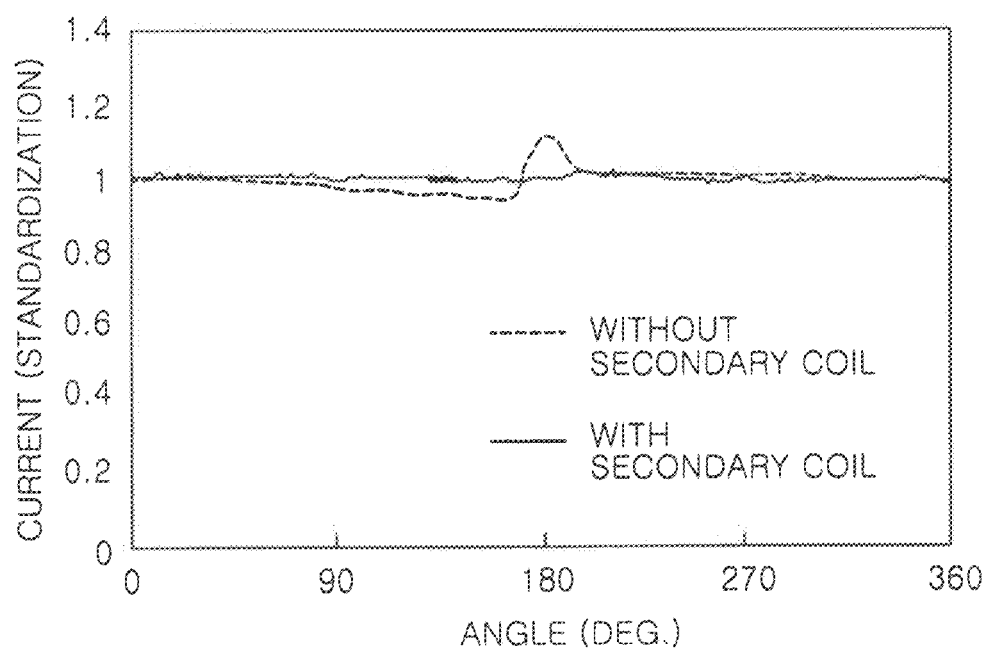
FIG. 9B is a circling plot diagram showing the distribution of the induced current that is excited in the plasma in the test example and the comparison example.

In other words, as a result of obtaining the distribution of an induced current that was excited in a plasma in the inductively coupled plasma etching apparatus shown in FIG. 1 where capacitors were inserted into the secondary coil 64, the characteristics shown in FIG. 9A (contour plot diagram) and FIG. 9B (circling plot diagram) were obtained. In FIGS. 9A and 9B, the distributions of the induced currents excited in the plasma were shown in the cases that no secondary coil 64 was provided and the primary coil 62 was provided on the top surface of the dielectric window 52 as a comparison example; and the coils 62 and 64 and the capacitors 90(1) to 90(4) were provided as a test example, in the inductively coupled plasma etching apparatus shown in FIG. 1.

In the electromagnetic field simulations, the primary coil 62 was formed of a concentric coil that was wound four times, where a first, a second, a third and a fourth wound portion had radials of about 70, 120, 170 and 220 mm, respectively. Conforming to the coil configuration of the primary coil 62, the secondary coil 64 included four concentrically arranged endless coils 64(1) to 64(4) having radials of about 70, 120, 170 and 220 mm, respectively.

In addition, in the electromagnetic field simulations, the secondary coil 64 was arranged on the top surface of the dielectric window 52, and the primary coil 62 was arranged above and at a distance of about 5 mm from the secondary coil 64. The capacitors 90(1) to 90(4) respectively had the capacitances of about 1547, 650, 400 and 250 pF. As the plasma generated in the doughnut by the inductive coupling in the processing space, a disk-shaped resistance was simulated, where its radius, resistivity and skin thickness were set to be about 250 mm, 100 Ωcm and 10 mm, respectively. The plasma-generating RF power $RF_H$ had a frequency of about 13.56 MHz.

As shown in FIGS. 9A and 9B, in the comparison example, it was seen that there was a bias in the induced current in the plasma approximately in the 9 o'clock direction (the 180° direction based on the forward direction of the X-axis in the circling direction) corresponding to a portion of an RF power supply input/output terminal of the primary coil 62. On the other hand, in the test example, it was seen that there was no bias in the circling direction. Further, it has been known that the induced current in the plasma which is nonuniform in the radial direction results in a uniform plasma density in the diametrical direction after the diffusion.

Figure 10:
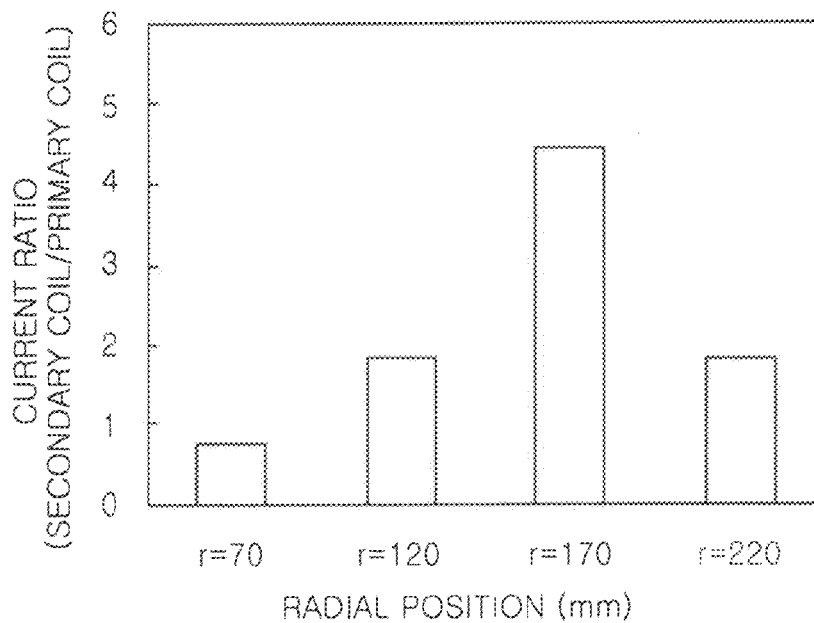
FIG. 10 is a bar graph showing a ratio of an induced (secondary) current flowing through an endless coil provided at each radial position of a secondary coil to an RF (primary) current flowing through a primary coil in the test example.

Additionally, in the test example of the electromagnetic field simulations, as the result of obtaining the induced (secondary) current flowing through each of the endless coils 64(1) to 64(4) of the secondary coil 64 when an RF (primary) current of 1 A was supplied to the primary coil 62 in the RF antenna 54, the graph shown in FIG. 10 showing the ratio of the induced (secondary) current of each radial position to the RF (primary) current was obtained. FIG. 10 indicates that the induced (secondary) current increased about one to five times as much as the RF (primary) current flowed at each radial position.

Figure 11:
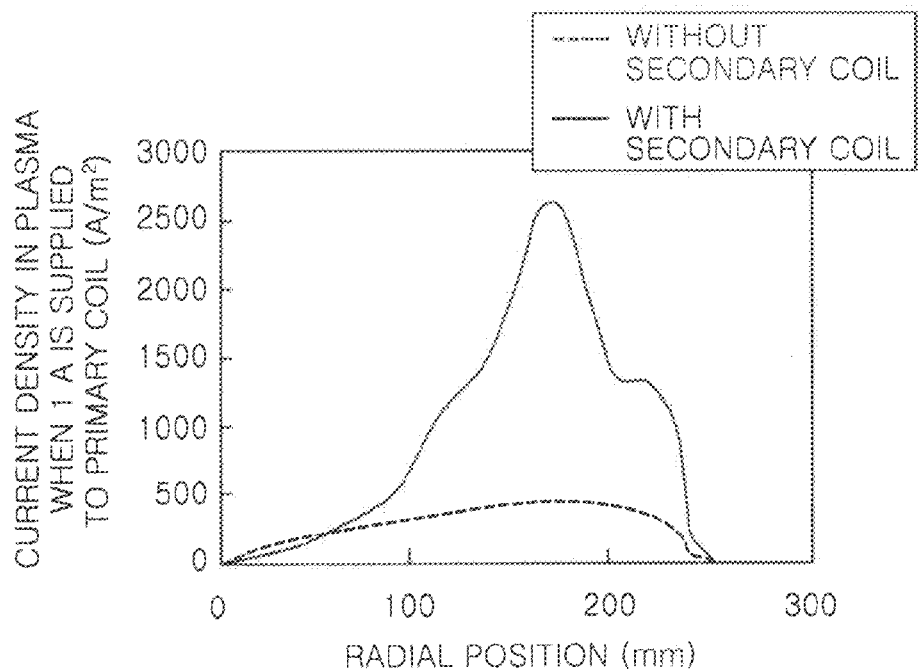
FIG. 11 is a graph showing a radial distribution of the density of a current that is excited in the plasma when an RF current of 1 A is supplied to the primary coil in the test example and the comparison example.

Moreover, in the test example and the comparison example, the characteristics shown in FIG. 11 were obtained as the result of analysis on a radial distribution of the density (corresponding to the plasma density) of a current excited in the plasma. FIG. 11 indicates that there was the difference by about five times at the maximum in the current density in the plasma depending on whether or not the secondary coil 64 existed and, resultantly, a large current could be generated in the plasma by the current multiplication effect.

Typically, in the inductive coupling method, it is required to increase the winding density of an antenna or a coil in order to increase a current excited in the plasma. This, however, inevitably extends the length of the coil, causing the wavelength effect. On the other hand, in the present embodiment, it is possible to increase the current excited in the plasma without increasing the winding density. Further, since it is sufficient to supply a small current from the matcher 72 of the RF power supply unit 58 to the primary coil 62, it is possible to easily perform the matching while preventing a power loss in the matcher 72.

In the present embodiment, it is preferable to employ variable capacitors as the capacitors provided in the loop of the secondary coil 64. In the electromagnetic field simulations, variable capacitors were employed for the capacitors 90(1) to 90(4) respectively provided in the loops of the endless coils 64(1) to 64(4), and the induced (secondary) current flowing through each radial position of the endless coils 64(1) to 64(4) was obtained by variously changing the each capacitance of the capacitors 90(1) to 90(4) with a plurality of combinations. Resultantly, the characteristics shown in FIGS. 12A to 16B were obtained as the radial distribution of the densities of currents generated in the plasma and the ratios of the induced (secondary) currents of respective radial positions to the RF (primary) currents of the primary coil 62.

(First Capacitance Adjusting Example)

Figure 12A:
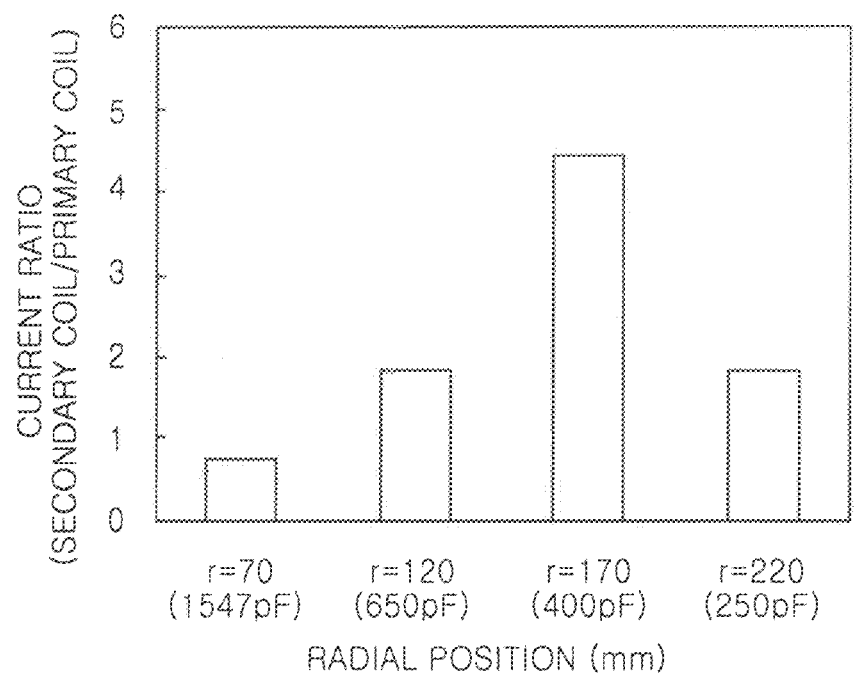
FIG. 12A is a bar graph showing a ratio of an induced (secondary) current flowing through an endless coil provided at each radial position of the secondary coil to an RF (primary) current flowing through the primary coil in a first capacitance adjusting example of the test example.
Figure 12B:
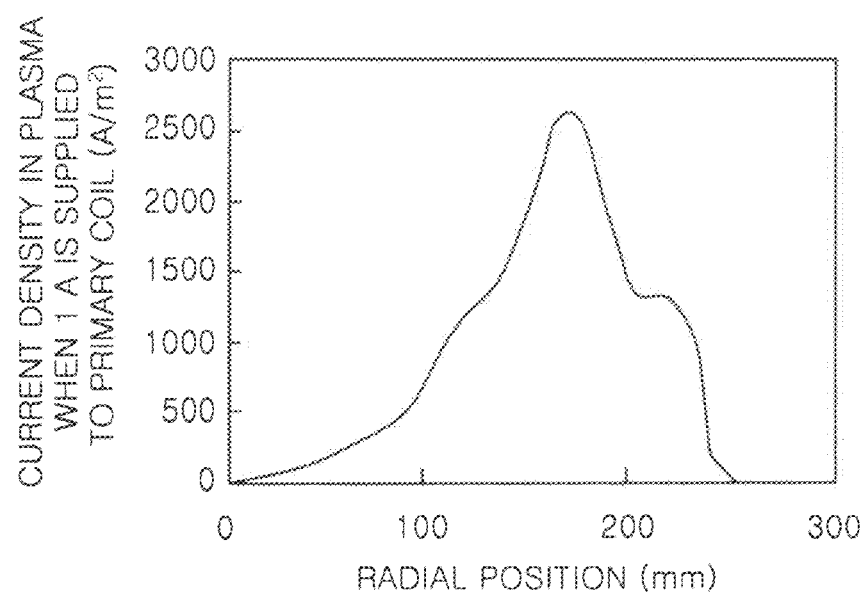
FIG. 12B is a graph showing a radial distribution of the density of a current that is excited in the plasma when an RF current of 1 A is supplied to the primary coil in the first capacitance adjusting example of the test example.

In case that the capacitances of the capacitors 90(1) to 90(4) were respectively set to be 1547, 650, 400 and 250 pF, the results shown in FIGS. 12A and 12B were respectively obtained as the ratios of the induced (secondary) currents to the RF (primary) currents and the radial distribution of the density of currents generated in the plasma.

Specifically, as shown in FIG. 12A, the largest current flowed through the endless coil 64(3) (r=170 mm), and the smallest current flowed through the endless coil 64(1) (r=70 mm). Intermediate currents respectively flowed through the endless coils 64(2) (r=120) and 64(3) (r=220). Moreover, as shown in FIG. 12B, the radial distribution of the density of currents generated in the plasma showed a profile of the relative magnitude relationship of the induced currents of the four respective radial positions. That is, the density of currents generated in the plasma showed a mountain-shaped profile in which it had a significantly great value around a portion r=170 mm.

(Second Capacitance Adjusting Example)

Figure 13A:
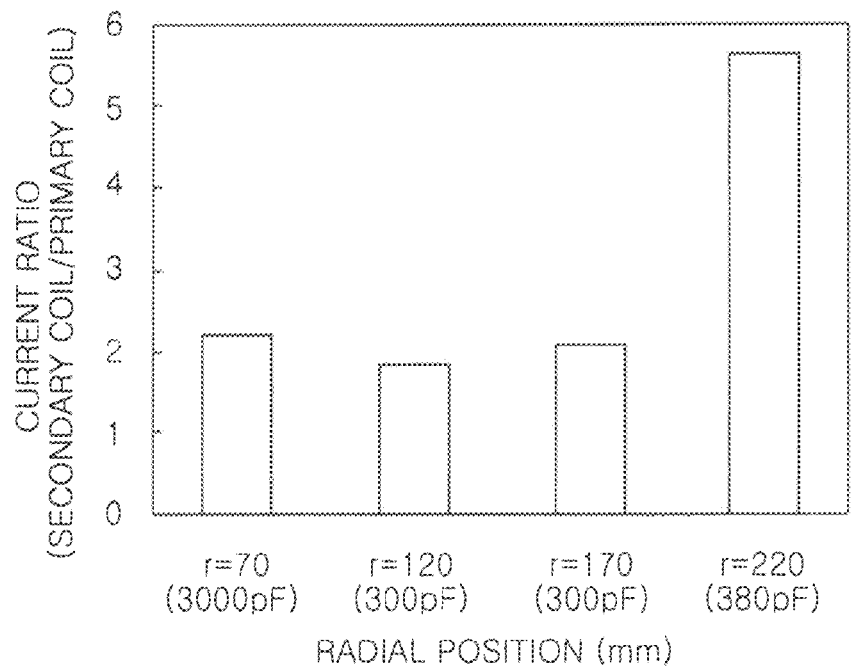
FIG. 13A is a bar graph showing a ratio of an induced (secondary) current flowing through an endless coil provided at each radial position of the secondary coil to an RF (primary) current flowing through the primary coil in a second capacitance adjusting example of the test example.
Figure 13B:
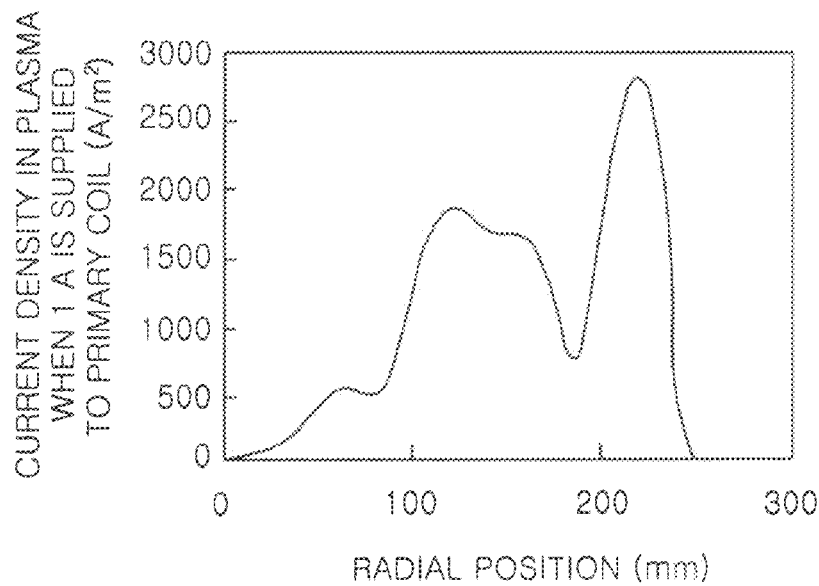
FIG. 13B is a graph showing a radial distribution of the density of a current that is excited in the plasma when an RF current of 1 A is supplied to the primary coil in the second capacitance adjusting example of the test example.

In case that the capacitances of the capacitors 90(1) to 90(4) were respectively set to be 3000, 300, 300 and 380 pF, the results shown in FIGS. 13A and 13B were respectively obtained as the ratios of the induced (secondary) currents to the RF (primary) currents and the radial distribution of the density of currents generated in the plasma.

Specifically, as shown in FIG. 13A, the largest current flowed through the endless coil 64(4) (r=220 mm), and currents of magnitudes of about ⅓ of that of the largest current respectively flowed through the other endless coils 64(1) to

64(3) (r=70, 120 and 170). Moreover, as shown in FIG. 13B, the radial distribution of the density of currents generated in the plasma showed a profile of the relative magnitude relationship of the induced currents of the four respective radial positions. That is, the density of currents generated in the plasma showed a profile in which the current density of a portion (r=70 mm) closer to the center in the radial direction tended to become lower than that of an intermediate portion (r=120 to 170) in the radial direction.

(Third Capacitance Adjusting Example)

Figure 14A:
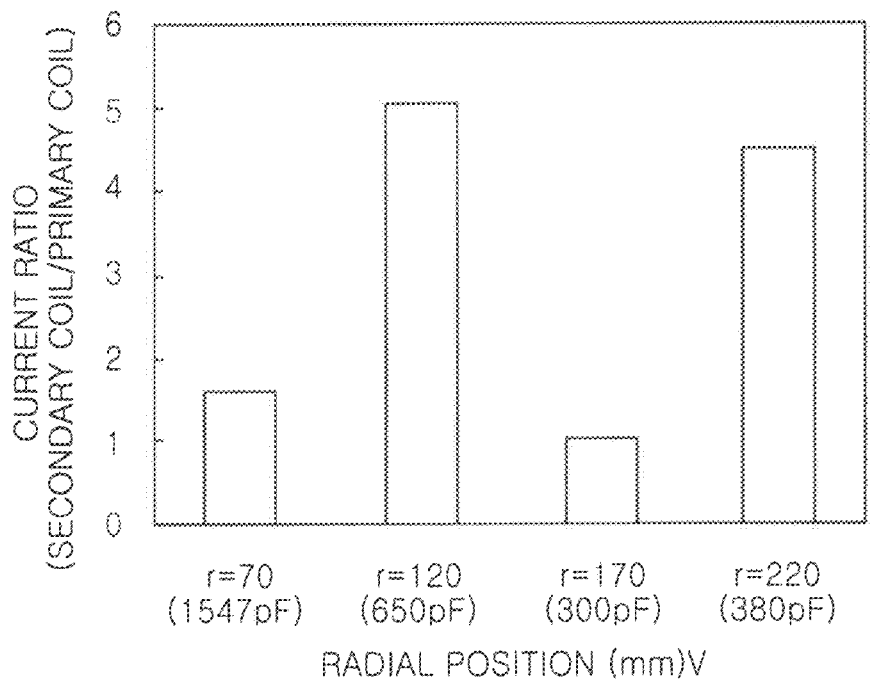
FIG. 14A is a bar graph showing a ratio of an induced (secondary) current flowing through an endless coil provided at each radial position of the secondary coil to an RF (primary) current flowing through the primary coil in a third capacitance adjusting example of the test example.
Figure 14B:
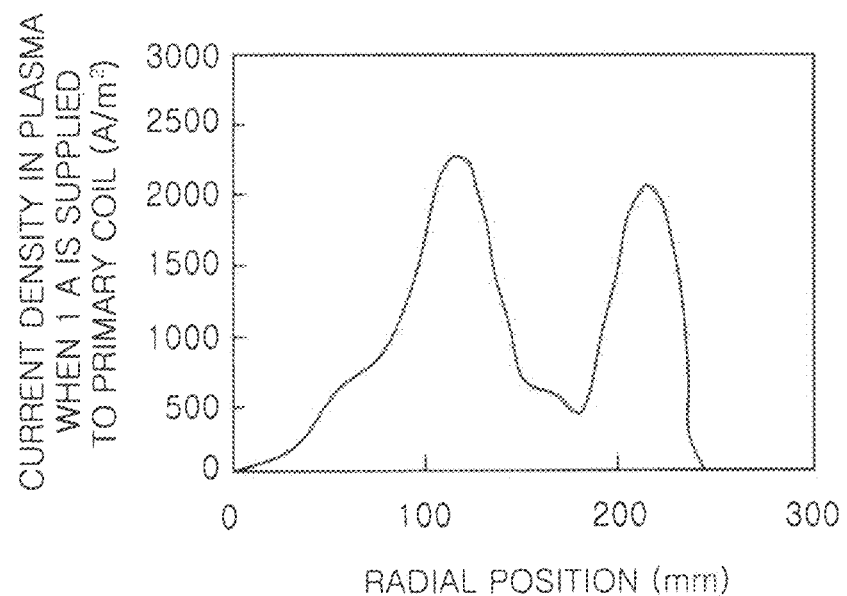
FIG. 14B is a graph showing a radial distribution of the density of a current that is excited in the plasma when an RF current of 1 A is supplied to the primary coil in the third capacitance adjusting example of the test example.

In case that the capacitances of the capacitors 90(1) to 90(4) were respectively set to be 1547, 650, 300 and 380 pF, the results shown in FIGS. 14A and 14B were respectively obtained as the ratios of the induced (secondary) currents to the RF (primary) currents and the radial distribution of the density of currents generated in the plasma.

Specifically, as shown in FIG. 14A, the induced currents were divided into two groups. That is, larger currents flowed respectively through the endless coils 64(2) and 64(4) (r=120 and 220 mm), and smaller currents respectively flowed through the endless coils 64(1) to 64(3) (r=70 and 170). Moreover, as shown in FIG. 14B, the radial distribution of the density of currents generated in the plasma showed a profile of the relative magnitude relationship of the induced currents of the four respective radial positions. That is, the density of currents generated in the plasma showed a profile in which it had local maximum values around two intermediate portions (r=120 and 170 mm, respectively) in the radial direction.

(Fourth Capacitance Adjusting Example)

Figure 15A:
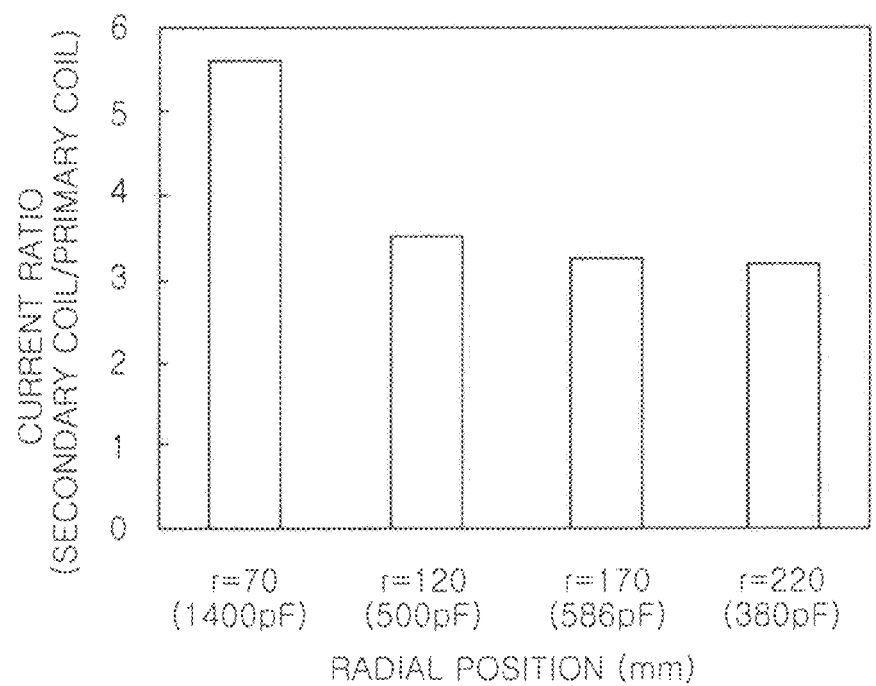
FIG. 15A is a bar graph showing a ratio of an induced (secondary) current flowing through an endless coil provided at each radial position of the secondary coil to an RF (primary) current flowing through a primary coil in a fourth capacitance adjusting example of the test example.
Figure 15B:
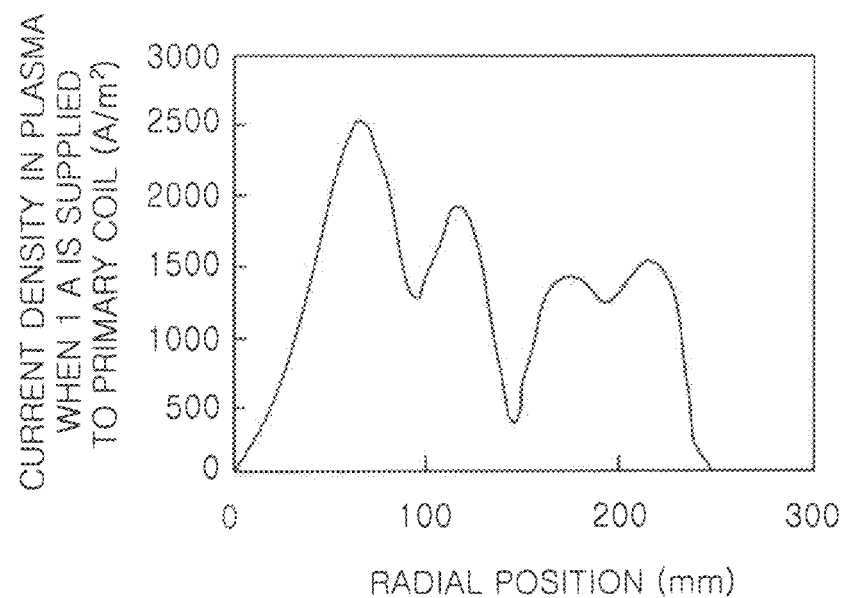
FIG. 15B is a graph showing a radial distribution of the density of a current that is excited in the plasma when an RF current of 1 A is supplied to the primary coil in the fourth capacitance adjusting example of the test example.

In case that the capacitances of the capacitors 90(1) to 90(4) were respectively set to be 1400, 500, 586 and 380 pF, the results shown in FIGS. 15A and 15B were respectively obtained as the ratios of the induced (secondary) currents to the RF (primary) currents and the radial distribution of the density of currents generated in the plasma.

Specifically, as shown in FIG. 15A, the largest current flowed through the endless coil 64(1) (r=70 mm), and currents of magnitudes of about ⅗ of that of the largest current respectively flowed through the other endless coils 64(2) to 64(4) (r=120, 170 and 220). Moreover, as shown in FIG. 15B, the radial distribution of the density of currents generated in the plasma showed a profile of the relative magnitude relationship of the induced currents of the four respective radial positions. The density of currents generated in the plasma was significantly decreased around an intermediate portion (r=120 to 170 mm) in the radial direction.

(Fifth Capacitance Adjusting Example)

Figure 16A:
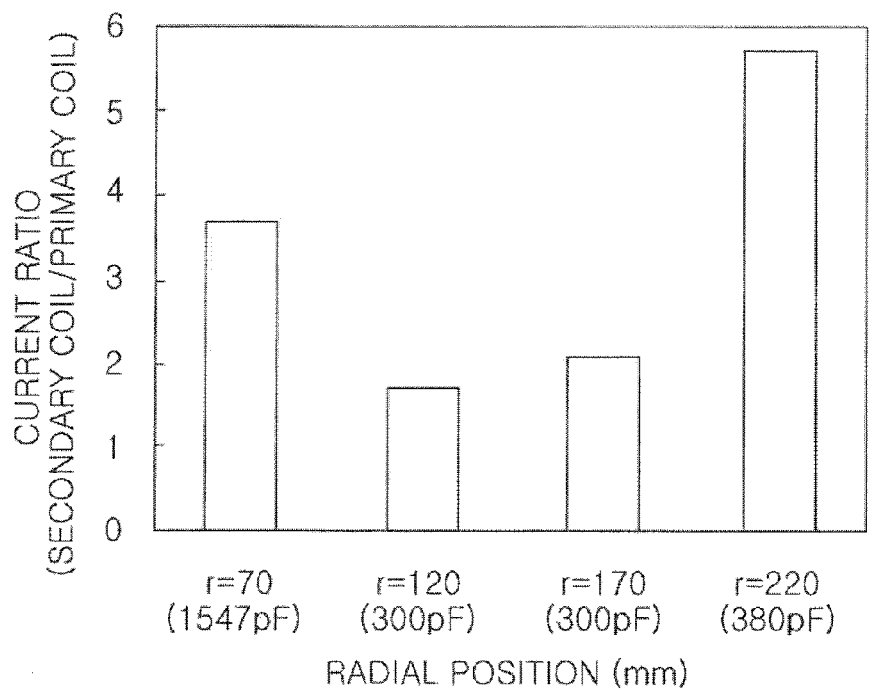
FIG. 16A is a bar graph showing a ratio of an induced (secondary) current flowing through an endless coil provided at each radial position of the secondary coil to an RF (primary) current flowing through the primary coil in a fifth capacitance adjusting example of the test example.
Figure 16B:
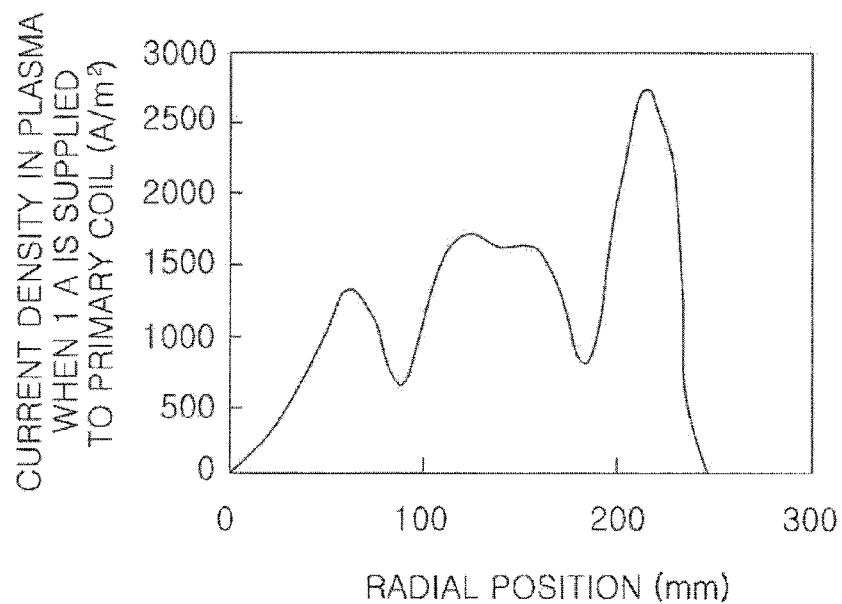
FIG. 16B is a graph showing a radial distribution of the density of a current that is excited in the plasma when an RF current of 1 A is supplied to the primary coil in the fifth capacitance adjusting example of the test example.

In case that the capacitances of the capacitors 90(1) to 90(4) were respectively set to be 1547, 300, 300 and 380 pF, the results shown in FIGS. 16A and 16B were respectively obtained as the ratios of the induced (secondary) currents to the RF (primary) currents and the radial distribution of the density of currents generated in the plasma.

Specifically, as shown in FIG. 16A, the largest current flowed through the endless coil 64(4) (r=220 mm), and a current of magnitude of about ⅔ of that of the largest current flowed through the endless coil 64(1) (r=70 mm). Currents of magnitudes of about ⅓ of that of the largest current respectively flowed through the endless coils 64(2) and 64(3) (r=120 and 170). Moreover, as shown in FIG. 16B, the radial distribution of the density of currents generated in the plasma showed a profile of the relative magnitude relationship of the induced currents of the four respective radial positions.

As described above, in the inductively coupled plasma etching apparatus of the present embodiment, by providing variable capacitors in the loops of the secondary coil 64 in the RF antenna 54 and changing the capacitances of the variable capacitors, it is possible to control the radial distribution of the density of the current excited in the plasma (i.e., the plasma density in the plasma generated in the doughnut shape) and, furthermore, to arbitrarily or multifariously control the radial distribution of the plasma density at a portion close to the susceptor 12 (on the semiconductor wafer W). Accordingly, it is possible to improve the uniformity of the plasma density and, furthermore, the uniformity of the plasma process even in the radial direction.

The inductively coupled plasma etching apparatus of the present embodiment may be appropriately applied to the application in which a multilayered film on the surface of a target substrate is continuously etched at a plurality of steps.

Hereinafter, a multilayer resist method shown in FIGS. 17A to 17D in accordance with another embodiment of the present invention will be described.

As shown in FIGS. 17A to 17D, in a main surface of the semiconductor wafer W serving as a target substrate to be processed, an SiN layer 102 serving as a lowermost layer (final mask) is formed on an original target film (e.g., a gate Si film) to be processed. An organic film (e.g., carbon film) 104 serving as an intermediate layer is formed on the SiN layer 102. A photoresist 108 serving as an uppermost layer is formed on the organic film 104 via a Si-containing bottom anti-reflective coating (BARC) film 106. The SiN layer 102, the organic film 104 and the BARC film 106 are formed by using the chemical vapor deposition (CVD) or the spin-on coating method. The photoresist 108 is patterned by the photolithography.

Figure 17A:
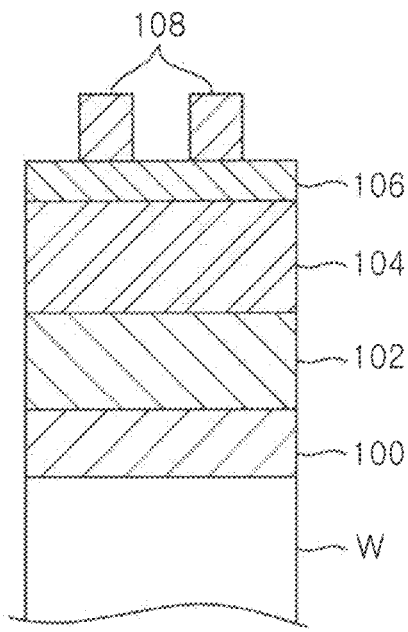
FIGS. 17A to 17D stepwisely show a process of a multilayer resist method.

First, in a first etching process step, as shown in FIG. 17A, the Si-containing BARC film 106 is etched by using the patterned photoresist 108 as a mask. In this case, a gaseous mixture of $CF_4$ and $O_2$ is employed as an etching gas, and the pressure inside the chamber 10 is set to be relatively low, e.g., 10 mTorr.

Figure 17B:
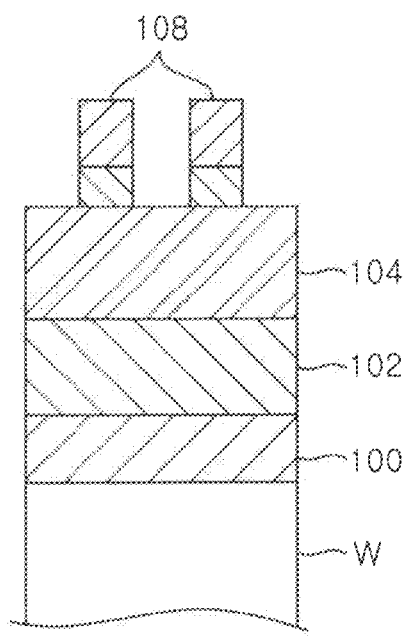

Next, in a second etching process step, as shown in FIG. 17B, the organic film 104 is etched by using as a mask the photoresist 108 and the BARC film. In this case, a single $O_2$ gas is employed as an etching gas, and the pressure inside the chamber 10 is set to be relatively lower, e.g., 5 mTorr.

Figure 17C:
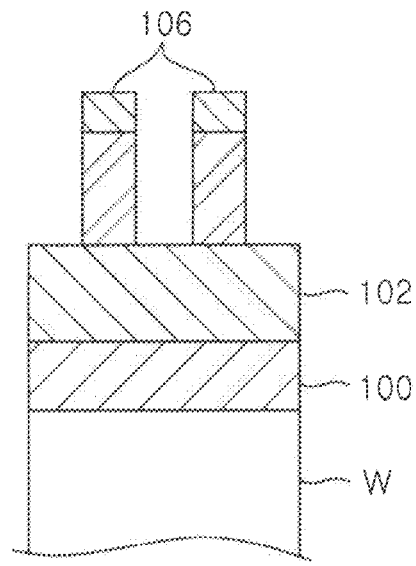
Figure 17D:
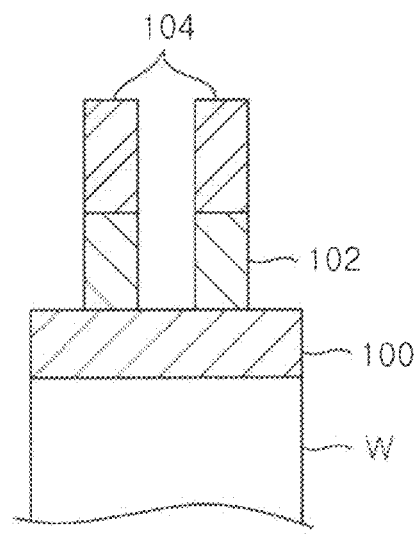

Finally, in a third etching process step, as shown in FIGS. 17C and 17D, the SiN 102 is etched by using as a mask the patterned BARC 106 and the organic film 104. In this case, a gaseous mixture of $CHF_3$, $CF_4$, Ar and $O_2$ is employed as an etching gas, and the pressure inside the chamber 10 is set to be relatively high, e.g., 50 mTorr.

In such multiple etching process steps, the process conditions are entirely or partially (especially, the pressure in the chamber 10) changed and, thus, the plasma generated in the doughnut shape is diffused in another form in the processing space. Here, in case that no secondary coil 64 is provided, the electron density (plasma density) around the susceptor 12 in the first and the second step (pressure of 10 mTorr or less) show a precipitous mountain-shaped profile in which it has a relatively significantly high value at the central portion. The electron density in the third step (pressure of 50 mTorr) has a gentle mountain-shaped profile in which it has a slightly high value at the central portion.

In accordance with the present embodiment, in, e.g., a process recipe, the capacitances of the capacitors 90(1) to 90(n) (e.g., n=4) are set as one of the process parameters or recipe information in order to add the capacitances into the typical process conditions (the magnitude of the RF power, pressure, gas type, gas flow rate and the like). Then, when the multiple etching process steps are performed, the main control unit 74 reads out data corresponding to the capacitances of the capacitors 90(1) to 90(n) from a memory and, at each step, sets the capacitances of the capacitors 90(1) to 90(n) to preset (target) values.

Accordingly, in the etching process steps of the multilayer resist method, the first step (10 mTorr), the second step (5 mTorr) and the third step (50 mTorr) are respectively converted into the first, the second and the third capacitance adjusting example.

As such, it is possible to variously control the capacitances of the capacitors 90(1) to 90(n) depending on the adjustment, the conversion and the change of the process conditions during the single plasma process or the multiple plasma processes of one semiconductor wafer W. Accordingly, it is possible to improve the uniformity of the plasma process by multifariously or optimally the radial distribution of a plasma density around the susceptor 12 (on the semiconductor wafer W) through the entire processing time or the entire steps of the single-wafer plasma process.

Figure 18:
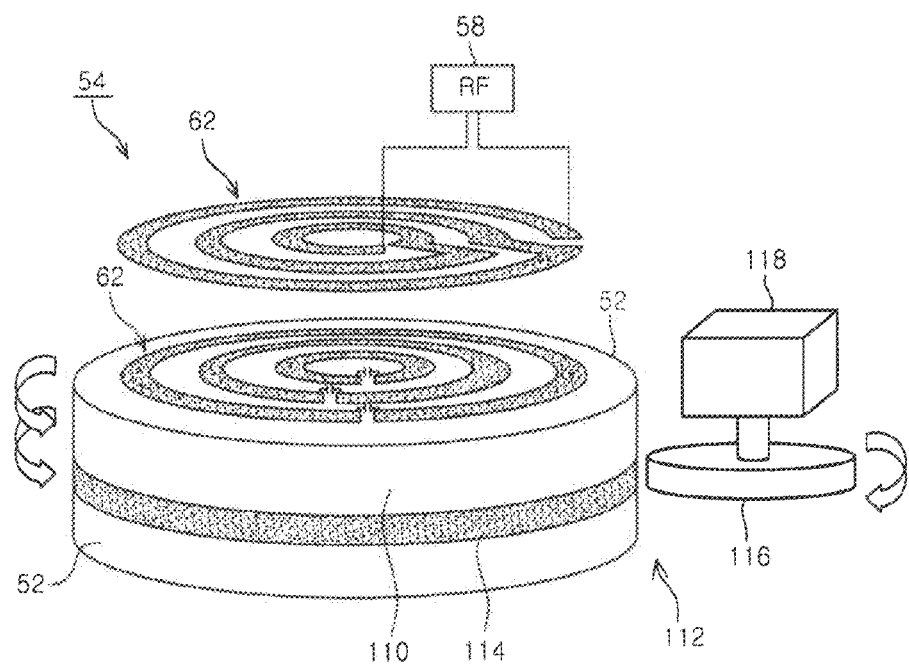
FIG. 18 is a perspective view showing a test example where the secondary coil is rotated in the inductively coupled plasma etching apparatus in accordance with the present embodiment.

FIG. 18 schematically shows a test example where the secondary coil 64 of the RF antenna 54 is rotated in the inductively coupled plasma etching apparatus of the present embodiment. As described above, in case that the capacitors are provided in the loops of the secondary coil 64, the asymmetric property of the secondary coil 64 may become lost at the portions where the capacitors are provided, and a bias may be generated in the plasma density distribution in the circling direction.

In this case, by rotating the secondary coil 64 about its central axis, it is possible to temporally make uniform the electric variations generated in the loops of the secondary coil 64, to thereby improve the uniformity of the plasma density distribution in the circling (azimuthal) direction. As described above, since the secondary coil is formed of completely closed loops without requiring the line connection to the outside, it is possible to rotate the secondary coil 64 only or the secondary coil 64 and a supporting unit 110 only.

In FIG. 18, a rotating mechanism includes the supporting unit 110 formed of a dielectric circular plate body; a rotation ring 114 coupled to the supporting unit 110; a pulley or pinion 116; and a rotational driving unit 118 having a motor for rotating the rotation ring 114 via the pinion 116.

Figure 19:
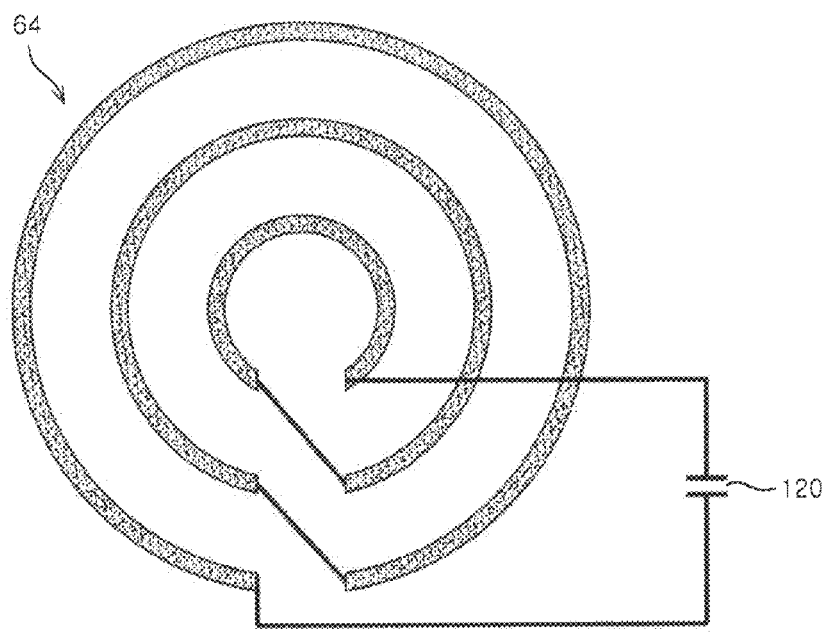
FIG. 19 is a top view showing a modification of a coil configuration of the secondary coil in accordance with the present embodiment.

The layout configuration of the secondary coil 64 is not limited to the above-mentioned case where one or more endless coils 64(1), 64((2) . . . are concentrically arranged. For example, the secondary coil 64 may have a series-connected single-wound or multi-wound concentric coil, or a capacitor 120 provided in the loop of the entire coil as shown in FIG. 19. Alternatively, the secondary coil 64 may have a spiral shape, which is not shown.

Further, in case that the capacitor is provided in the loop of the secondary coil 64, the series resonance may be easily generated in the loop and, thus, a small Q value causes the series resonance rapidly changed. This makes it difficult to control the secondary coil 64 or causes discrepancy in each coil. Accordingly, in order to prevent such disadvantage, it is preferable to use a relatively high-resistivity metal or semiconductor (e.g., silicon crystal doped with N or P to have conductivity, or the like) as a material of the secondary coil 64. Alternatively, in addition to the capacitor, a resistor may be provided.

In the meanwhile, it is known that the resistivity of the resistor inserted into the loop of the secondary coil 64 from the outside or the resistivity of the coil body is increased as the temperature is increased. In case that the regular RF power $RF_H$ is supplied to the RF antenna 54, the amount of the RF power $RF_H$ consumed is increased as the resistivity of the secondary coil 64 is increased. Resultantly, it is expected that the amount of the current flowing to the primary coil 62 is decreased. Accordingly, it is possible to prevent a significantly large current from flowing to one coil. Further, it can be expected that the current flowing in the RF antenna 54 is automatically made uniform.

Besides, it is preferable to cool the RF antenna 54, especially the secondary coil 64, by using an air-cooling method or a water-cooling method. As such, in the case of cooling the coil 64(62), by changing the cooling temperature, it is possible to adjust the resistivity of the coil 64(62), to thereby control the current flowing in the coil 64(62).

Meanwhile, the shape of the loops of the primary coil 62 and the secondary coil 64 included in the RF antenna 54 is not limited to the circular shape. The loops thereof may have a quadrangular shape, a hexagonal shape or the like. The cross sectional shapes of the primary coil 62 and the secondary coil 64 are also not limited to the rectangle. The cross sectional shapes may have a circular shape, an elliptical shape or the like. Further, instead of the single wire, the twisted wire may be employed.

In the aforementioned embodiments of the present invention, the configuration of the inductively coupled plasma etching apparatus is merely an example. Various modifications of the units of the plasma-generation mechanism and units having no direct involvement in the plasma generation may be made.

For example, the RF antenna 54 may have various outer shapes such as a domical shape instead of the planar outer shape. Moreover, a processing gas may be supplied through the ceiling of the chamber 10 from the processing gas supply unit, and no DC bias controlling RF power $RF_L$ may be supplied to the susceptor 12.

In the above embodiments, the inductively coupled plasma processing apparatus or the plasma processing method therefor is not limited to the technical field of the plasma etching, but is applicable to other plasma processes such as a plasma CVD process, a plasma oxidizing process, a plasma nitriding process and the like. In the embodiments, the target substrate to be processed is not limited to the semiconductor wafer. For example, the target substrate may be one of various kinds of substrates, which can be used in a flat panel display (FPD), a photomask, a CD substrate, a print substrate or the like.

In accordance with the present invention, it is possible to provide an inductively coupled plasma processing apparatus and a plasma processing method therefor, capable of improving the uniformity and controllability of plasma density distribution, with a simple configuration of its RF antenna that can easily be manufactured, since loads of its RF power supply system become small by the above-mentioned configurations and operations.

While the invention has been shown and described with respect to the embodiments, it will be understood by those skilled in the art that various changes and modifications may be made without departing from the scope of the invention as defined in the following claims.

What is claimed is:
1. A plasma processing apparatus comprising:
    a processing chamber including a dielectric window;
    a substrate supporting unit, provided in the processing chamber, for mounting thereon a target substrate to be processed;
    a processing gas supply unit for supplying a desired processing gas to the processing chamber to perform a desired plasma process on the target substrate;
    a first RF antenna, provided on the dielectric window, for generating a plasma from the processing gas by an inductive coupling in the processing chamber; and a first RF power supply unit for supplying an RF power to the first RF antenna, the RF power having an appropriate frequency for RF discharge of the processing gas, wherein the first RF antenna includes:

a primary coil provided on or above the dielectric window and electrically connected to the first RF power supply unit through an RF power supply line; and a secondary coil coupled with the primary coil by an electromagnetic induction therebetween without being connected to any RF power supply unit, the secondary coil being arranged closer to a bottom surface of the dielectric window than the primary coil, and wherein the secondary coil is formed as a plurality of disjointed endless coils, and wherein diameters of the endless coils are different from each other.

2. The apparatus of claim 1, wherein an electric field is induced in the processing chamber by an induced current flowing through the secondary coil, and a plasma is generated from the processing gas by the induced electric field.

3. The apparatus of claim 1, wherein the secondary coil is electrically floated from the primary coil.

4. The apparatus of claim 1, wherein the primary coil and the secondary coil are arranged in parallel with the dielectric window.

5. The apparatus of claim 1, wherein the endless coils are concentrically arranged.

6. The apparatus of claim 5, wherein the primary coil is formed as a multi-wound concentric coil, and a plurality of wound portions of the primary coil is disposed, respectively, opposite to the endless coils of the secondary coil.

7. The apparatus of claim 1, wherein each of the endless coils forms a loop without a capacitor interposed therein.

8. The apparatus of claim 1, wherein the primary coil is formed as a multi-wound concentric coil, and a plurality of wound portions of the primary coil is disposed, respectively, opposite to the endless coils of the secondary coil.

9. The apparatus of claim 1, wherein the primary coil is provided above the dielectric window.

10. The apparatus of claim 1, wherein the secondary coil includes at least three disjointed endless coils that all have different diameters from each other.

* * * * *